United States Patent
Watanabe et al.

(10) Patent No.: US 9,390,889 B2
(45) Date of Patent: Jul. 12, 2016

(54) ION IMPLANTER AND METHOD OF ION BEAM TUNING

(71) Applicant: Sumitomo Heavy Industries Ion Technology Co., Ltd., Tokyo (JP)

(72) Inventors: Kazuhiro Watanabe, Ehime (JP); Yuuji Takahashi, Ehime (JP); Yusuke Ueno, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/852,037

(22) Filed: Sep. 11, 2015

(65) Prior Publication Data

US 2016/0079032 A1     Mar. 17, 2016

(30) Foreign Application Priority Data

Sep. 11, 2014 (JP) ................. 2014-184995

(51) Int. Cl.
*H01J 37/304* (2006.01)
*H01J 37/317* (2006.01)
*H01J 37/244* (2006.01)

(52) U.S. Cl.
CPC ............. *H01J 37/304* (2013.01); *H01J 37/244* (2013.01); *H01J 37/3171* (2013.01); *H01J 2237/24514* (2013.01)

(58) Field of Classification Search
USPC .................................................. 250/492.21
See application file for complete search history.

(56) References Cited

U.S. PATENT DOCUMENTS

| 4,667,111 A | 5/1987 | Glavish et al. |
| 6,242,747 B1 | 6/2001 | Sugitani et al. |
| 7,429,743 B2 | 9/2008 | Kabasawa et al. |
| 2015/0136996 A1* | 5/2015 | Inada .................. H01J 37/3171 250/396 R |

FOREIGN PATENT DOCUMENTS

| JP | S62-115640 A | 5/1987 |
| JP | H06-028146 A | 4/1994 |
| JP | 3448731 B2 | 9/2003 |
| JP | 2003-331764 A | 11/2003 |
| JP | 2006-156259 A | 6/2006 |

* cited by examiner

*Primary Examiner* — Kiet T Nguyen
(74) *Attorney, Agent, or Firm* — Michael Best and Friedrich

(57) ABSTRACT

An energy analysis slit of an ion implanter is configured to enable switching between a standard slit opening used for implantation processing performed under a predetermined implantation condition and a high-precision slit opening having higher energy precision than the standard slit opening and used to tune an acceleration parameter for a radio frequency linear accelerator. The acceleration parameter is determined for the predetermined implantation condition so that at least a part of ions supplied to the radio frequency linear accelerator is accelerated to have target energy, and so that the beam current amount measured by a beam measurement unit is equivalent to a target beam current amount.

24 Claims, 16 Drawing Sheets

ION IMPLANTER AND METHOD OF ION BEAM TUNING

RELATED APPLICATION

Priority is claimed to Japanese Patent Application No. 2014-184995, filed on Sep. 11, 2014, the entire content of which is incorporated herein by reference.

BACKGROUND OF THE INVENTION

1. Field of the Invention

The present invention relates to an ion implanter and a method of tuning an ion beam.

2. Description of the Related Art

An ion implanter including a radio frequency linear accelerator is known. Such an ion implanter is used for high energy ion implantation in a normal case. An ion beam accelerated or decelerated by the radio frequency linear accelerator has a certain energy width. That is, the ion beam exiting from the radio frequency linear accelerator contains not only ions having desired energy but also ions having higher (or lower) energy than it. Thus, an energy analysis magnet and an energy analysis slit can be provided at the downstream of the radio frequency linear accelerator. The energy analysis magnet can convert energy deviation among the accelerated or decelerated ions into ion trajectory deviation. Since the energy analysis slit is arranged on a trajectory of ions having specified energy, the ions having the energy pass through the energy analysis slit and are guided to a workpiece.

Ideally, the energy analysis slit allows only ions having desired energy to pass therethrough and blocks ions having different energy from it. However, in reality, the energy analysis slit has a certain small slit width. For this reason, the energy analysis slit allows not only the ions having desired energy but also ions having slightly higher energy (or slightly lower energy) than the desired energy to pass therethrough.

The narrower the slit width of the energy analysis slit is, the more the resolution is improved, which contributes to improvement of implantation energy precision to a workpiece. On the other hand, since the amount of the ion beam passing through the slit is reduced, productivity of the ion implanter is lowered. In this manner, in an existing high energy ion implanter, the energy precision and the productivity are in a trade-off relationship regarding design of the energy analysis slit.

SUMMARY OF THE INVENTION

An illustrative object of an aspect of the present invention is to achieve improvement of energy precision while avoiding lowering of productivity of an ion implanter.

According to one aspect of the present invention, there is provided an ion implanter including: a radio frequency linear accelerator that accelerates supplied ions in accordance with an acceleration parameter; an energy analysis magnet that is arranged downstream of the radio frequency linear accelerator; an energy analysis slit assembly that is arranged downstream of the energy analysis magnet; a beam measurement unit that measures a beam current amount at a downstream of the energy analysis slit assembly; and a controller that determines the acceleration parameter for a predetermined implantation condition, wherein the acceleration parameter is determined so that at least a part of the supplied ions is accelerated to have target energy, and so that the beam current amount measured by the beam measurement unit is equivalent to a target beam current amount, and wherein the energy analysis slit assembly is configured to enable switching between a standard slit opening used for implantation processing performed under the predetermined implantation condition and a high-precision slit opening having higher energy precision than the standard slit opening and used to tune the acceleration parameter.

According to another aspect of the present invention, there is provided an ion implanter including: a radio frequency linear accelerator that accelerates supplied ions in accordance with an acceleration parameter; an energy analysis magnet that is arranged downstream of the radio frequency linear accelerator and that generates an ion deflecting magnetic field in a vertical direction perpendicular to a beam traveling direction; an energy analysis slit assembly that is arranged downstream of the energy analysis magnet and that is configured to enable switching between a standard slit opening having a first slit width in a horizontal direction perpendicular to the beam traveling direction and the vertical direction and a high-precision slit opening having a second slit width that is narrower than the first slit width in the horizontal direction; a beam measurement unit that measures a beam current amount at a downstream of the energy analysis slit assembly; and a controller that determines the acceleration parameter based on a beam current amount measured by the beam measurement unit with use of the high-precision slit opening.

According to another aspect of the present invention, there is provided a method of ion beam tuning in an ion implanter, the ion implanter including a radio frequency linear accelerator that accelerates supplied ions in accordance with an acceleration parameter, an energy analysis magnet that is arranged downstream of the radio frequency linear accelerator, and an energy analysis slit assembly that is arranged downstream of the energy analysis magnet, the energy analysis slit assembly configured to enable switching between a standard slit opening used for implantation processing performed under a predetermined implantation condition and a high-precision slit opening having higher energy precision than the standard slit opening and used to determine the acceleration parameter, the method including: switching the energy analysis slit assembly to the high-precision slit opening; measuring a beam current amount at a downstream of the high-precision slit opening; and determining the acceleration parameter for the predetermined implantation condition so that at least a part of the supplied ions is accelerated to have target energy, and so that the beam current amount measured is equivalent to a target beam current amount.

Optional combinations of the aforementioned constituting elements, and implementations of the invention in the form of methods, apparatuses, systems, computer programs, data structures, and recording media may also be practiced as additional modes of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
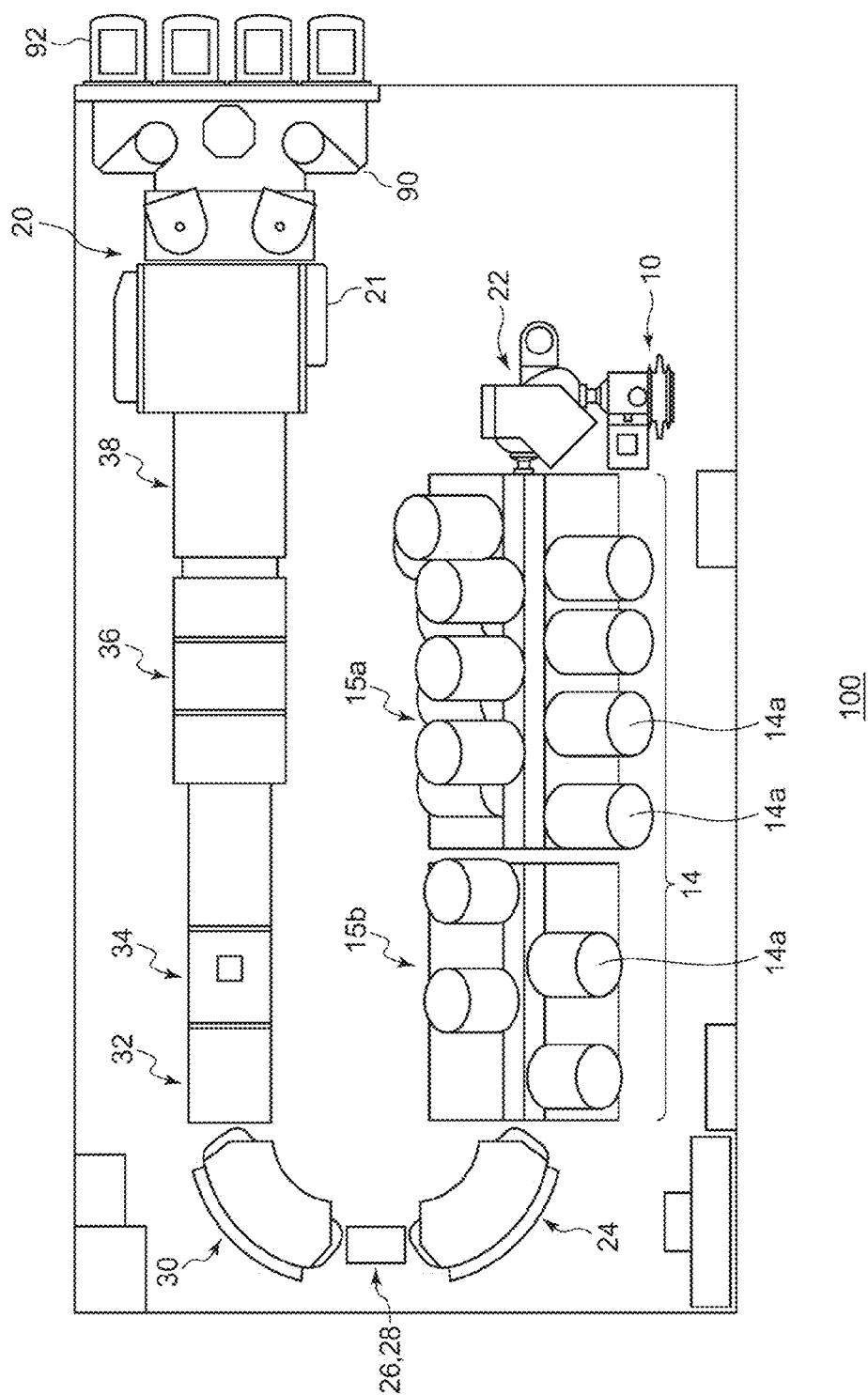
FIG. 1 is a schematic top view of an ion implanter according to an embodiment of the present invention.

The invention will now be described by reference to the preferred embodiments. This does not intend to limit the scope of the present invention, but to exemplify the invention.

Hereinafter, embodiments of the present invention will be described in detail with reference to the drawings. The same reference sign will be assigned to the same element in the drawings, and duplicate description thereof will not be presented as is appropriate. The configurations described below are merely examples but are not for purposes of limiting the scope of the present invention.

Figure 2:
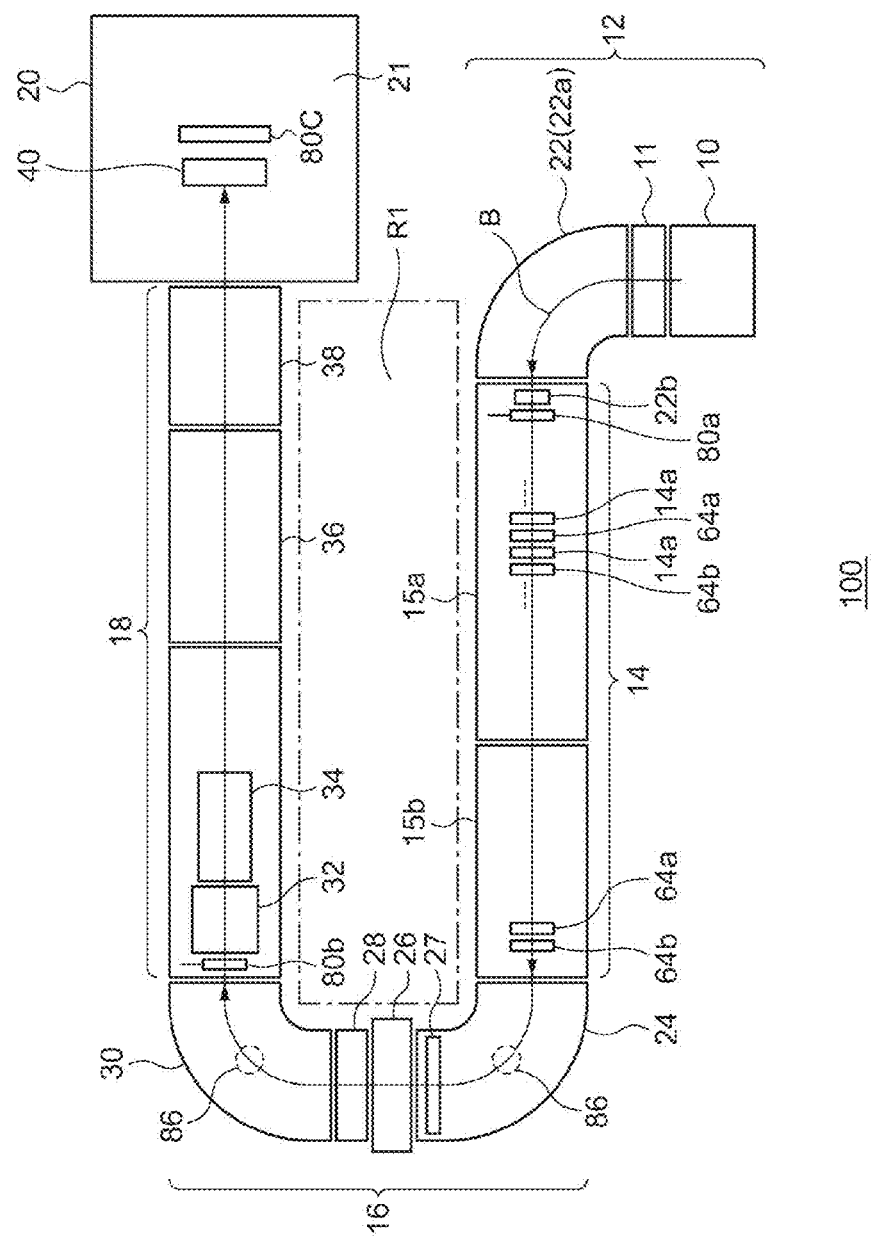
FIG. 2 schematically shows a layout of components constituting the ion implanter shown in FIG. 1.

FIG. 1 is a schematic top view of an ion implanter 100 according to an embodiment of the present invention. FIG. 2 schematically shows a layout of components constituting the ion implanter 100 shown in FIG. 1. The ion implanter 100 is suitably used as a so-called high energy ion implanter. The high energy ion implanter is provided with an ion accelerator of radio frequency linear acceleration type and a high energy ion transportation beamline. The high energy ion implanter accelerates ions generated by an ion source 10 to have high energy, transports a resultant ion beam B to a workpiece (e.g., a substrate or a wafer 40) along the beamline, and implants ions into the workpiece.

As shown in FIGS. 1 and/or 2, the ion implanter 100 comprises an ion beam generation unit 12 configured to generate ions and subject the ions to mass separation; a high energy multistage linear acceleration unit 14 configured to accelerate the ions supplied from the ion beam generation unit 12 based on an acceleration parameter; a beam deflection unit 16 configured to bend a trajectory of the ion beam B in a U shape; a beam transportation line unit 18 configured to transport the ion beam B to the wafer 40; and a substrate processing and supplying unit 20 configured to uniformly implant the transported ion beam B into a semiconductor wafer.

The ion beam generation unit 12 is provided with an ion source 10, an extraction electrode 11, and a mass analyzer 22 as shown in FIG. 2. The ion beam generation unit 12 is configured to extract and accelerate a beam from the ion source 10 by the extraction electrode 11. The extracted and accelerated beam is subject to mass analysis by the mass analyzer 22. The mass analyzer 22 is provided with a mass analysis magnet 22a and a mass analysis slit 22b. The mass analysis slit 22b is placed inside the entrance of the high energy multistage linear acceleration unit 14, which is the next component of the mass analyzer 22. The mass analysis slit 22b may be placed immediately after the mass analysis magnet 22a (that is, immediately before the high energy multistage linear acceleration unit 14).

A first beam measuring instrument 80a that measures the total beam current of the ion beam is disposed at the foremost portion inside a linear acceleration portion housing of the high energy multistage linear acceleration unit 14. The first beam measuring instrument 80a may be inserted into and extracted from the beamline in the vertical direction by a driving mechanism. The first beam measuring instrument 80a is a Faraday cup, for example. This Faraday cup is also referred to as an injector Faraday cup. The injector Faraday cup is formed so that an opening faces the upstream side of the beamline while having a rectangular square shape in the vertical direction. The first beam measuring instrument 80a is used to measure the total beam current of the ion beam B during tuning of the ion source 10 and/or the mass analysis magnet 22a. The first beam measuring instrument 80a may also be used on the beamline to completely interrupt the ion beam B reaching the downstream side of the beamline if necessary.

Only the ion species necessary for implantation is selected in mass analysis by the mass analyzer 22. The ion beam B comprised of the selected ion species is guided to the high energy multistage linear acceleration unit 14 in the next stage. The high energy multistage linear acceleration unit 14 includes a first linear accelerator 15a for use in normal high energy ion implantation. The first linear accelerator 15a includes one or more (e.g., a plurality of) radio frequency resonators 14a. The high energy multistage linear acceleration unit 14 may include a second linear accelerator 15b as well as the first linear accelerator 15a. The second linear accelerator 15b is used together with the first linear accelerator 15a for ultra high energy ion implantation. The second linear accelerator 15b includes one or more (e.g., a plurality of) radio frequency resonators 14a. The direction of the ion beam B further accelerated by the high energy multistage linear acceleration unit 14 is changed by the beam deflection unit 16.

The first linear accelerator 15a includes the plurality of radio frequency resonators 14a and a plurality of focusing/ defocusing lenses 64. Each radio frequency resonator 14a includes a tubular electrode. Each focusing/defocusing lens 64 is an electric field lens (e.g., an electrostatic quadrupole electrode (Q lens)), for example. The focusing/defocusing lens 64 may be a magnetic field lens (e.g., a quadrupole electromagnet). The tubular electrodes of the radio frequency resonators 14a and the focusing/defocusing lenses 64 (e.g., the Q lenses) are arranged alternately in line, and the ion beam B passes through the centers of these components. Similarly to the first linear accelerator 15a, the second linear accelerator 15b also includes the plurality of radio frequency resonators 14a and the plurality of focusing/defocusing lenses 64.

The focusing/defocusing lenses 64 are disposed to control focusing/defocusing of the ion beam B during or after acceleration and efficiently transport the ion beam B. The focusing/defocusing lenses 64 are disposed inside, before and/or behind the radio frequency linear accelerator as many as needed. Horizontal focusing lenses 64a and vertical focusing lenses 64b are alternately provided. That is, the horizontal focusing lens 64a is disposed at the position before (or behind) the tubular electrode of the radio frequency resonator 14a while the vertical focusing lens 64b is disposed at the position behind (or before) the tubular electrode of the radio frequency resonator 14a. An additional vertical focusing lens 64b is disposed behind the horizontal focusing lens 64a at the termination end of the second linear accelerator 15b. The convergence and the divergence of the ion beam B passing through the high energy multistage linear acceleration unit 14 are tuned, which causes the ion beam B having an optimal two-dimensional beam profile to be incident to the beam deflection unit 16 of the rear stage.

In the radio frequency linear accelerator, amplitude V [kV] and frequency f [Hz] of a voltage to be applied to the tubular electrode of each radio frequency resonator 14a are considered as the set of acceleration parameters of the radio frequency (RF). In a case where multistage radio frequency acceleration is performed, mutual phase $\phi$ [deg] of the radio frequency resonators 14a is added as the acceleration parameter. These amplitude V, frequency f, and phase $\phi$ are the parameter items of the radio frequency (RF). A fixed value may be used for the frequency f. Also, an operation parameter for the focusing/defocusing lens 64 (also referred to as a focusing/defocusing parameter) is considered. An example of the focusing/defocusing parameter is a Q lens voltage.

The high energy ion beam B exiting from the high energy multistage linear acceleration unit 14 has a certain range of energy distribution. For this reason, in order to scan and collimate the high energy ion beam B and irradiate the wafer 40 with the high energy ion beam B with desired implantation precision, it is preferable to perform a highly precise energy analysis, center trajectory correction, and beam focusing/defocusing tuning in advance.

The beam deflection unit 16 performs the energy analysis, the center trajectory correction, and the energy dispersion control on the high energy ion beam. The beam deflection unit 16 includes at least two highly precise deflection electromagnets, at least one energy width confining slit, at least one energy analysis slit, and at least one horizontal focusing unit. The plurality of deflection electromagnets are formed so as to perform the energy analysis of the high energy ion beam, the precise correction of the ion implantation angle, and the suppression of the energy dispersion.

The beam deflection unit 16 includes an energy analysis magnet 24, an energy width confining slit 27, a horizontal focusing quadrupole lens 26, an energy analysis slit assembly (hereinafter also referred to as an energy analysis slit) 28, and a steering magnet 30. The energy analysis magnet 24 is disposed at the downstream of the high energy multistage linear acceleration unit 14. The energy width confining slit 27 and the energy analysis slit 28 will be described in detail below. The horizontal focusing quadrupole lens 26 reduces energy dispersion. The steering magnet 30 provides steering (trajectory adjustment). The direction of the ion beam B is changed by the beam deflection unit 16, causing the ion beam B to travel toward the wafer 40.

A second beam measuring instrument 80b that measures the beam current amount is disposed at the downstream of the energy analysis slit 28. The second beam measuring instrument 80b is disposed at the foremost portion inside a scanner housing or immediately before a beam focusing/defocusing device 32. The second beam measuring instrument 80b may be inserted into and extracted from the beamline in the vertical direction by a driving mechanism. The second beam measuring instrument 80b is a Faraday cup, for example. This Faraday cup is also referred to as a resolver Faraday cup. The resolver Faraday cup is formed so that an opening faces the upstream side of the beamline while having a rectangular square shape in the horizontal direction. The second beam measuring instrument 80b is used to measure the total beam current of the ion beam B during tuning of the high energy multistage linear acceleration unit 14 and/or the beam deflection unit 16. The second beam measuring instrument 80b may also be used on the beamline to completely interrupt the ion beam B reaching the downstream side of the beamline if necessary.

The energy analysis magnet 24 is one at the most upstream side out of the plurality of deflection electromagnets in the beam deflection unit 16. The energy analysis magnet 24 may be called an energy filter magnet (EFM). The steering magnet 30 is one at the most downstream side out of the plurality of deflection electromagnets in the beam deflection unit 16.

The ions that pass through the deflection electromagnet of the beam deflection unit 16 are subjected to a centrifugal force and a Lorentz force, and hence draws a circular-arc trajectory by balance of these forces. This balance is represented by a relation of $mv=qBr$. Here, m indicates the mass of the ion, v indicates the velocity of the ion, q indicates the valence number of the ion, B indicates the magnetic flux density of the deflection electromagnet, and r indicates the curvature radius of the trajectory. Only the ions in which the curvature radius r of the trajectory matches the curvature radius of the magnetic center of the deflection electromagnet may pass through the deflection electromagnet. In other words, in a case in which the ions have the same valence number, the ions that may pass through the deflection electromagnet applied with the uniform magnetic field B are only the ions having the specific momentum mv. The energy analysis magnet 24 is actually a device that is used to analyze the momentum of the ion. Similarly, the steering magnet 30 and the mass analysis magnet 22a are momentum filters.

The beam deflection unit 16 may deflect the ion beam B by 180° by using a plurality of magnets. Accordingly, the high energy ion implanter in which the beamline has a U shape may be achieved with a simple configuration. The energy analysis magnet 24 and the steering magnet 30 are respectively formed so as to have deflection angles of 90°. As a result, the total deflection angle becomes 180°. Furthermore, the amount of the deflection performed by each magnet is not limited to 90°, and the following combination may be available.

(1) One magnet having deflection amount of 90° and two magnets having deflection amounts of 45°

(2) Three magnets having deflection amounts of 60°

(3) Four magnets having deflection amounts of 45°

(4) Six magnets having deflection amounts of 30°

(5) One magnet having deflection amount of 60° and one magnet having deflection amount of 120°

(6) One magnet having deflection amount of 30° and one magnet having deflection amount of 150°

Since the energy analysis magnet 24 needs high magnetic field precision, a highly precise magnetic field measurement device 86 for precisely measuring the magnetic field is provided. The magnetic field measurement device 86 is appropriate combination of a nuclear magnetic resonance (NMR) probe called a magnetic resonance probe (MRP) and a Hall probe. The MRP is used to calibrate the Hall probe, and the Hall probe is used in a feedback control for a constant magnetic field. Further, the energy analysis magnet 24 is manufactured with strict precision so that the magnetic field uniformity becomes less than 0.01%. The steering magnet 30 is similarly provided with a magnetic field measurement device 86. The magnetic field measurement device 86 of the steering magnet 30 may be provided with a Hall probe only. Further, each of the energy analysis magnet 24 and the steering magnet 30 is connected with a power supply and its control device that provides current setting precision and current stability of $1\times10^{-4}$ or less.

The beam transportation line unit 18 is used to transport the ion beam B exiting from the beam deflection unit 16, and includes the beam focusing/defocusing device 32 formed by a focusing/defocusing lens group, a beam scanner 34, a beam collimator 36, and an electrostatic final energy filter 38. The final energy filter 38 includes a final energy separation slit. The length of the beam transportation line unit 18 is designed so as to match the total length of the ion beam generation unit 12 and the high energy multistage linear acceleration unit 14. The beam transportation line unit 18 is connected to the high energy multistage linear acceleration unit 14 via the beam deflection unit 16 so as to form a U-shaped layout as a whole.

The substrate processing and supplying unit 20 is provided at the downstream end of the beam transportation line unit 18. The substrate processing and supplying unit 20 includes a vacuum processing chamber 21 configured to irradiate the wafer 40 with the ion beam B in the implantation processing. In the vacuum processing chamber 21 are accommodated a beam monitor for measuring the ion beam B's beam current, position, angle of implantation, convergence and divergence angle, and ion distribution in the vertical and horizontal directions; a static charge prevention device for preventing the wafer 40 from being charged by the ion beam B; a wafer transportation mechanism for transporting the wafer 40 into and out of the vacuum processing chamber and placing the wafer 40 at a proper position and angle; an electro static chuck (ESC) for supporting the wafer 40 during ion implantation; and a wafer scan mechanism for moving the wafer 40 during implantation in a direction perpendicular to the direction of beam scan at a speed determined by variation in the beam current.

In the substrate processing and supplying unit 20, a third beam measuring instrument 80c is disposed behind the ion implantation position. The third beam measuring instrument 80c is a fixed lateral elongated Faraday cup that measures the total beam current of the ion beam B, for example. This lateral elongated Faraday cup is also referred to as a tuning Faraday cup. The third beam measuring instrument 80c has a beam current measurement function capable of measuring the ion beam B in the entire scan range in the wafer region. The third beam measuring instrument 80c is configured to measure the final setup beam at the most downstream side of the beamline.

The substrate processing and supplying unit 20 is provided with a wafer transportation device 90 adjacent to the vacuum processing chamber 21 as shown in FIG. 1. The wafer transportation device 90 includes an intermediate transportation chamber, a load lock chamber, and an atmospheric transportation unit. The wafer transportation device 90 is configured to transport a workpiece such as a wafer stored in a cassette station 92 to the vacuum processing chamber 21. The wafer is transported from the cassette station 92 to the vacuum processing chamber 21 via the atmospheric transportation unit, the load lock chamber, and the intermediate transportation chamber. Conversely, the wafer subjected to ion implantation processing is transported to the cassette station 92 via the intermediate transportation chamber, the load lock chamber, and the atmospheric transportation unit.

Thus, the beamline unit of the ion implanter 100 is configured as a horizontal U-shaped folded-back beamline having two elongated straight portions facing each other. The upstream straight portion is comprised of a plurality of units for accelerating the ion beam B generated by the ion source 10. The downstream straight portion is comprised of a plurality of units for tuning the ion beam B with its course changed from the course traveled in the upstream straight portion and implanting the ion beam B into the wafer 40. The two straight portions are configured to have substantially the same length. A work space R1 having a room sufficiently large for maintenance work is provided between the two straight portions.

In this way, the high energy ion implanter that is formed by arranging the units in a U-shape ensures satisfactory workability while suppressing an increase in footprint. Further, in the high energy ion implanter, the units or the devices are formed as a module, and hence may be attached, detached, and assembled in accordance with the beamline reference position.

Since the high energy multistage linear acceleration unit 14 and the beam transportation line unit 18 are arranged in a folded-back layout, the overall length of the high energy ion implanter is minimized. In the related-art ion implanters, the units are arranged substantially in a linear layout. The radius of curvature of the plurality of deflection electromagnets forming the beam deflection unit 16 is optimally configured to minimize the width of the implanter. These measures minimize the footprint of the implanter and makes it possible to do a maintenance work on the components of the high energy multistage linear acceleration unit 14 and the beam transportation line unit 18 in the work space R1 sandwiched by the high energy multistage linear acceleration unit 14 and the beam transportation line unit 18. Because the ion source 10, which is characterized by relatively short maintenance intervals, and the substrate processing and supplying unit 20, in which a substrate needs to be supplied/retrieved, are arranged adjacent to each other, an operator does not need to move a lot.

Figure 3:
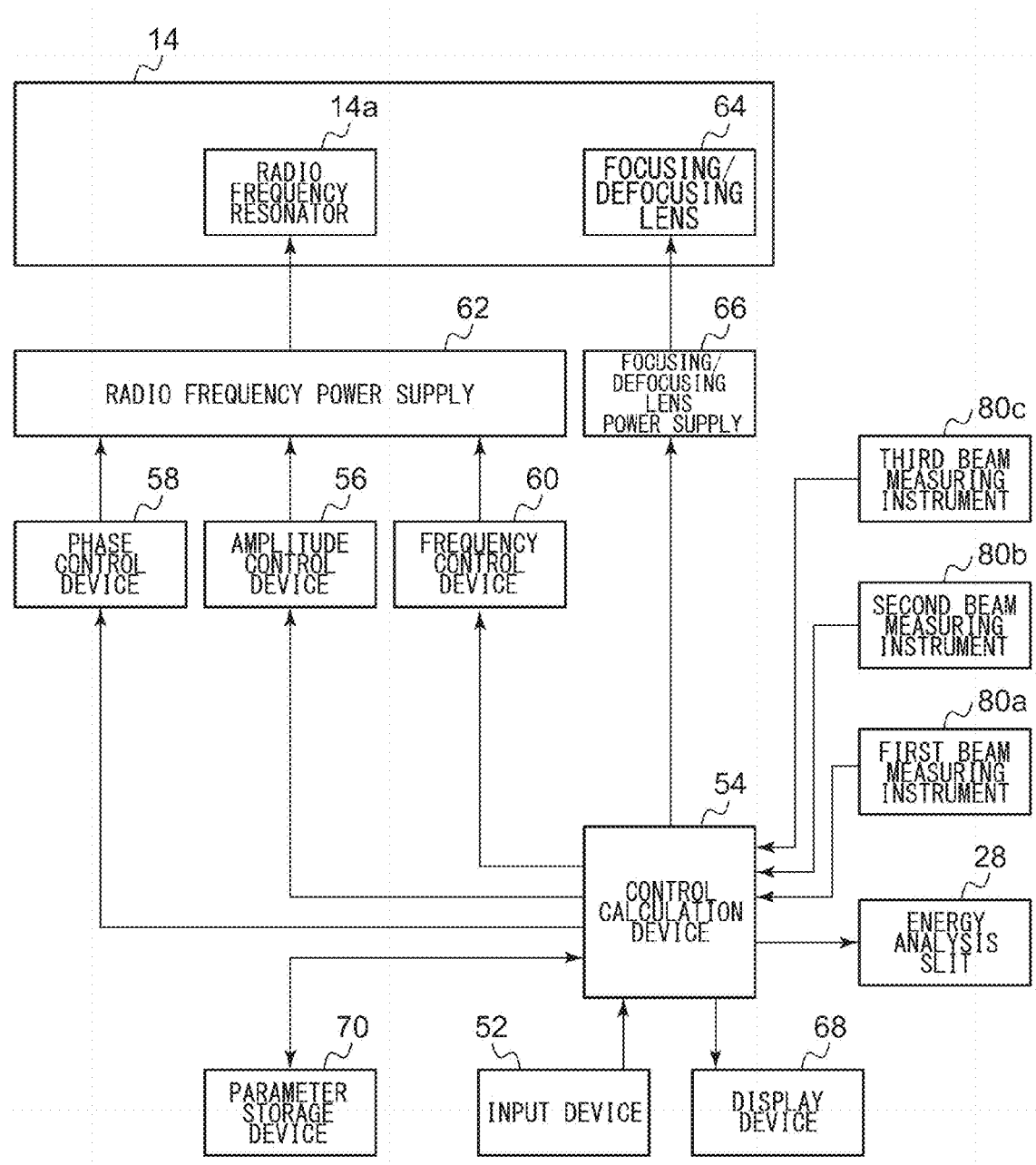
FIG. 3 is a block diagram showing a schematic configuration of a controller for a high energy multistage linear acceleration unit shown in FIGS. 1 and 2.

FIG. 3 is a block diagram showing a schematic configuration of a controller for the high energy multistage linear acceleration unit 14 shown in FIGS. 1 and 2. As the components necessary for the control of the high energy multistage linear acceleration unit 14, an input device 52 for allowing an operator to input a necessary condition, a control calculation device 54 that numerically calculates various parameters from the input condition and controls the components, an amplitude control device 56 that tunes the voltage amplitude of the radio frequency, a phase control device 58 that tunes the phase of the radio frequency, a frequency control device 60 that controls the frequency of the radio frequency, a radio frequency power supply 62 for the radio frequency resonators 14a, a focusing/defocusing lens power supply 66 for the focusing/defocusing lenses 64, a display device 68 that displays the acceleration parameter, the focusing/defocusing parameter, and other information thereon, and a parameter storage device 70 that stores the determined parameters are provided.

In the input device 52, an implantation condition and/or an initial condition for parameter calculation based on the implantation condition are/is input. The condition to be input includes the extraction voltage of the extraction electrode 11, the mass of the ion, and the valence number of the ion as conditions for incidence and the final energy as a condition for emission.

The control calculation device 54 for the radio frequency linear accelerator stores therein a numerical calculation code (a program) for numerically calculating various parameters in advance. In the control calculation device 54, the acceleration parameters (voltage amplitude, frequency, and/or phase) are calculated so as to obtain the optimal transportation efficiency by simulating the acceleration, focusing and defocusing of the ion beam based on the input condition with use of the numerical calculation code stored therein. Also, in the control calculation device 54, the operation parameter (e.g., a Q coil current or a Q electrode voltage) for the focusing/defocusing lens 64 that is used to efficiently transport the ion beam is also calculated. The input conditions and calculated various parameters are displayed on the display device 68. The display device 68 displays a non-answerable mark for the acceleration condition that exceeds the ability of the high energy multistage linear acceleration unit 14. Details of an example of a method of calculating the acceleration parameter and the focusing/defocusing parameter are disclosed in JP 3448731 B1, the entire content of which is incorporated herein by reference, for example.

The voltage amplitude parameter is transmitted from the control calculation device 54 to the amplitude control device 56, and the amplitude control device 56 tunes the amplitude of the radio frequency power supply 62. The phase parameter is transmitted to the phase control device 58, and the phase control device 58 tunes the phase of the radio frequency power supply 62. The frequency parameter is transmitted to the frequency control device 60. The frequency control device 60 controls the output frequency of the radio frequency power supply 62, and controls the resonance frequency of the radio frequency resonator 14a of the high energy multistage linear acceleration unit 14. Further, the control calculation device 54 controls the focusing/defocusing lens power supply 66 by the calculated focusing/defocusing lens parameter.

The control calculation device 54 may be configured to control the other components (e.g., at least one component included in the ion beam generation unit 12, the beam deflection unit 16, the beam transportation line unit 18, and the substrate processing and supplying unit 20) of the ion implanter 100. The control calculation device 54 may control at least one component (e.g., the energy analysis slit 28) of the ion implanter 100 based on a measurement result of at least one measurement unit (e.g., the first beam measuring instrument 80a, the second beam measuring instrument 80b, and/or the third measuring instrument 80c) of the ion implanter 100. Also, the power supply and its control device connected to each of the energy analysis magnet 24 and the steering magnet 30 may be controlled by the control calculation device 54.

Meanwhile, the beam accelerated or decelerated by the radio frequency linear accelerator has a certain energy width. Since the slit width of the energy analysis slit 28 has a finite size (that is, the slit width is not zero), the energy analysis slit allows not only ions having desired energy but also ions having slightly higher energy (or slightly lower energy) than the desired energy to pass therethrough. Accordingly, the beam transported to the downstream of the beamline has a slight energy width in accordance with the slit width.

As described above, the ion implanter 100 includes the final energy filter 38 performing energy analysis at the most downstream of the beamline. A set voltage of the final energy filter 38 is determined in accordance with energy of the passing ion. The bend angle of the ion in the final energy filter 38 is in inverse proportion to the energy. In a case in which the bend angle is 15 degrees, for example, the bend angle changes by 0.15 degrees per 1% change of the energy. That is, a 1% energy error corresponds to a 0.15-degree implantation angle error. Particularly in the high energy ion implantation, such an implantation angle error cannot be ignored in many cases. For example, in a case of implantation to a bottom of a high trench structure, the implantation angle can be approximately 0 degrees to the normal of the wafer. In this case, the ion implantation depth is quite sensitive to a channeling phenomenon, and the ion density distribution in the depth direction will change significantly by a slight angle difference.

If the slit width of the energy analysis slit 28 is reduced sufficiently, the aforementioned implantation angle error may be restricted or prevented. However, reduction of the slit width will bring about reduction of the ion beam amount to be transported, which causes lowering of productivity of the ion implanter 100. In a case in which productivity is emphasized, use of a wide slit width is desired. For example, a slit width for securing desired productivity in accordance with a certain implanter specification corresponds to 2.5% energy precision, for example.

Before a production phase performing predetermined implantation processing, the ion beam B for the implantation processing is prepared. Such a preparation phase includes a so-called auto beam setup. The auto beam setup is processing of tuning the respective units of the ion implanter 100 automatically to obtain a desired ion beam amount while monitoring the beam current at the downstream of the energy analysis slit 28. During the auto beam setup, the beam current is monitored by the second beam measuring instrument 80b or the third beam measuring instrument 80c, for example.

It is generally thought that the energy distribution of the ion beam B subjected to energy analysis is unimodal distribution having a peak at the center of the slit width. However, according to the present inventors' study, it has been found that such a thought is not true depending on the case. For example, in a case in which the aforementioned wide slit width (e.g., ±2.5%) is employed, and in which the auto beam setup is executed with use of the slit, the ion beam B at the downstream of the beamline obtained after the auto beam setup can have energy distribution far from the ideal unimodal shape. The ion beam B to be implanted can contain more ions having different energy from target energy than expected. Under such circumstances, a method of solving such a problem will be described in detail below.

In an embodiment, the ion implanter 100 is configured to accelerate the ion beam B in the high energy multistage linear acceleration unit 14 and perform energy analysis in the energy analysis magnet 24 and the energy analysis slit 28. The ion implanter 100 is configured to tune at least one parameter of the ion implanter 100 and to obtain feedback of a beam measurement result after tuning of the at least one parameter with a narrowed horizontal opening width of the energy analysis slit 28 that is arranged behind the energy analysis magnet 24 narrower than its normal opening width, and it thereby provides a beam having optimal energy precision and an optimal beam current amount.

Figure 4:
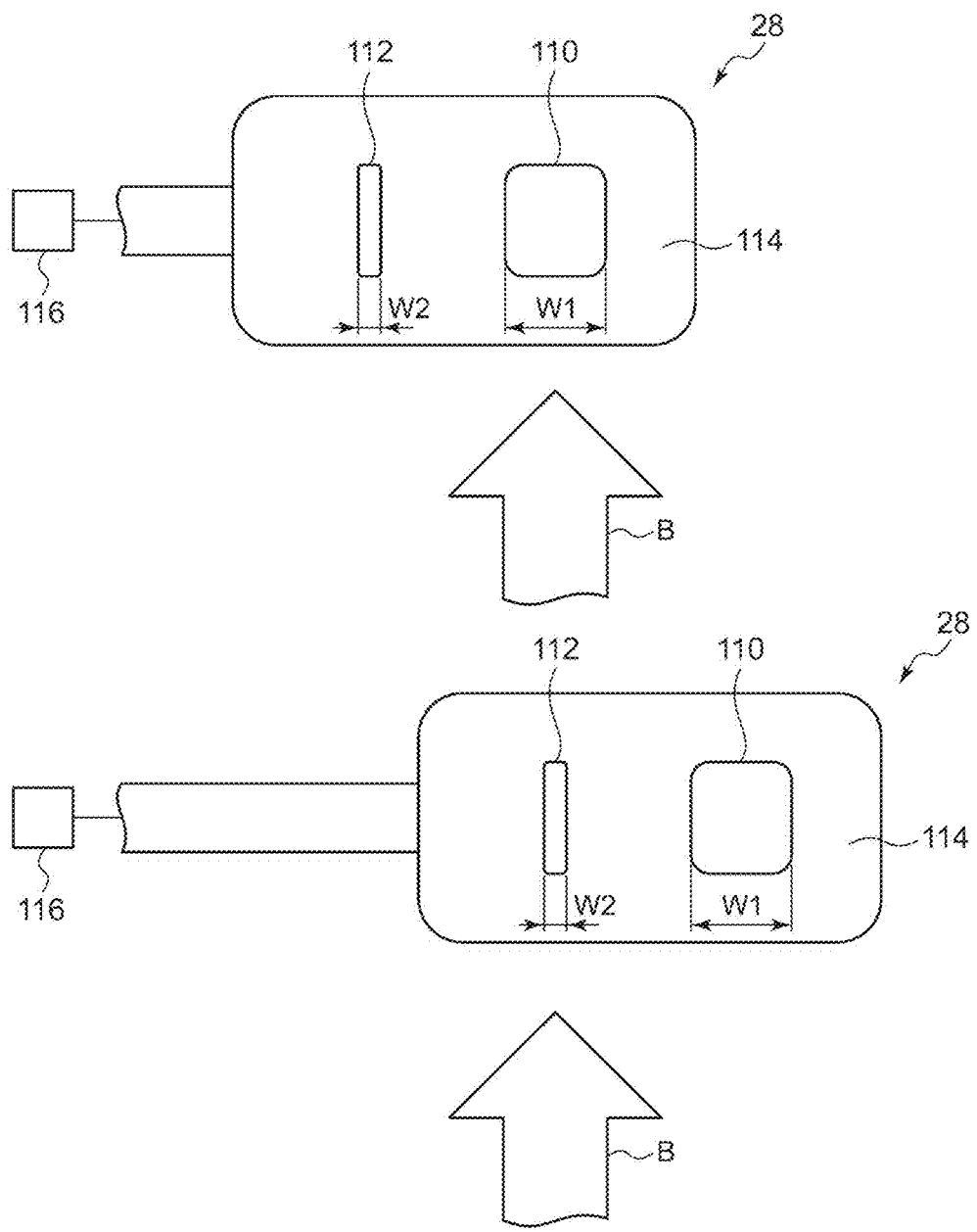
FIG. 4 is a schematic view of an energy analysis slit according to an embodiment of the present invention.

FIG. 4 is a schematic view of the energy analysis slit 28 according to an embodiment of the present invention. The energy analysis slit 28 is configured to enable switching between a standard slit opening 110 and a high-precision slit opening 112. The standard slit opening 110 is used for implantation processing to be carried out under a predetermined implantation condition. The high-precision slit opening 112 has higher energy precision than the standard slit opening 110 and is used to tune the acceleration parameter.

The standard slit opening 110 has a first slit width W1 in the horizontal direction. The high-precision slit opening 112 has a second slit width W2 in the horizontal direction. The second slit width W2 is narrower than the first slit width W1 in the horizontal direction. For example, the second slit width W2 is ⅕ of the first slit width W1. The horizontal direction is a direction perpendicular to the beam traveling direction and a vertical direction. The vertical direction is defined as a direction of a magnetic field generated by the energy analysis magnet 24. As described above, the energy analysis magnet 24 generates the magnetic field deflecting ions exiting from the high energy multistage linear acceleration unit 14. In other words, the high-precision slit opening 112 has a narrower width than the standard slit opening 110 in a direction that is perpendicular to the reference trajectory of the ion beam B and that lies on the plane of deflection in the energy analysis magnet 24.

The high-precision slit opening 112 is formed separately from the standard slit opening 110. As shown in FIG. 4, the standard slit opening 110 and the high-precision slit opening 112 are formed in one slit plate 114. The high-precision slit opening 112 is formed in a different position on the slit plate 114 in the horizontal direction from that of the standard slit opening 110. The high-precision slit opening 112 is also formed in an equal position in the vertical direction to that of the standard slit opening 110 with an equal height.

The energy analysis slit 28 is configured to enable selection between the standard slit opening 110 and the high-precision slit opening 112. The energy analysis slit 28 includes a slit driving unit 116 driving the slit plate 114 in the horizontal direction. Either the standard slit opening 110 or the high-precision slit opening 112 is, in use, positioned at a position in the horizontal direction to pass ions having the target energy therethrough. A state in which the ion beam B is incident into the standard slit opening 110 is shown in an upper part of FIG. 4 while a state in which the ion beam B is incident into the high-precision slit opening 112 is shown in a lower part of FIG. 4. The energy analysis slit 28 can also be referred to as a selectable resolving aperture (SRA).

Figure 5:
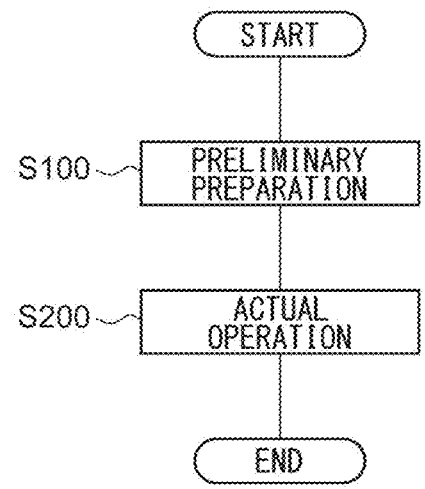
FIG. 5 is a flowchart illustrating an ion implantation method according to an embodiment of the present invention.

FIG. 5 is a flowchart illustrating an ion implantation method according to an embodiment of the present invention. This method includes a preparation phase and a production phase. The preparation phase includes a preliminary preparation or setup process (S100). The production phase includes an actual operation of the ion implanter 100 (S200).

A controller (e.g., the control calculation device 54, which is hereinafter applicable) executes preliminary preparation when a new implantation condition (also referred to as an implantation recipe) is provided. In the preliminary preparation, a data set history is created with use of the high-precision slit opening 112, details of which will be described below with reference to FIG. 6. The data set is created for each implantation condition.

After completion of the preliminary preparation, the wafer 40 is transported to the ion implanter 100 with use of a transportation container (e.g., a wafer cassette). Thus, the acceleration parameter is determined before the transportation container of the wafer 40 is mounted on the ion implanter 100 (e.g., vacuum processing chamber 21, the wafer transportation device 90, or the cassette station 92). That is, the acceleration parameter is determined before start of so-called lot processing.

The transportation container is a container for transporting the wafer 40 between the ion implanter 100 and another device and can contain one or a plurality of wafers 40. The transportation container is attached to the ion implanter 100 to enable the wafer 40 to be transported into (or out of) the vacuum processing chamber 21 from (or into) the transportation container. The wafer 40 and/or the transportation container may be transported automatically by a transportation device or manually by an operator.

When the transportation container is attached to the ion implanter 100, the controller can start the actual operation. In the actual operation, the controller executes the auto beam setup and implantation processing with use of the standard slit opening 110 as will be described in detail below with reference to FIG. 7. The controller may start the auto beam setup (or the implantation processing) in response to an operator's instruction for allowing execution of the auto beam setup (or the implantation processing).

Figure 6:
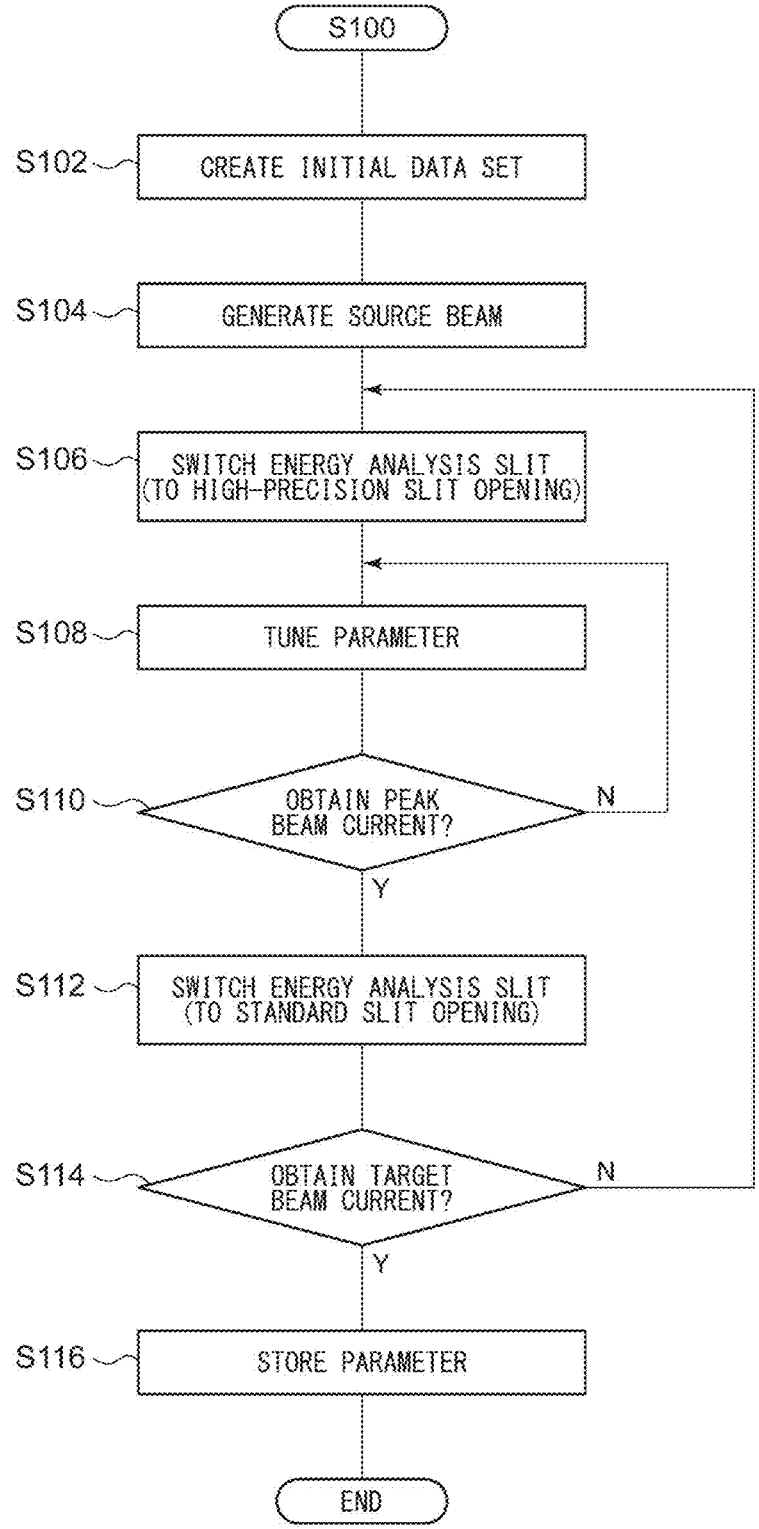
FIG. 6 is a flowchart illustrating a method of tuning an ion beam according to an embodiment of the present invention.

FIG. 6 is a flowchart illustrating a method of tuning an ion beam according to an embodiment of the present invention. This method corresponds to the preliminary preparation (S100) shown in FIG. 5. As the preliminary preparation, the controller determines a data set corresponding to a new implantation condition to be executed thereafter. The controller determines the data set based on the beam current amount to be measured by a beam measurement unit.

The data set includes the operation parameter (the aforementioned acceleration parameter and focusing/defocusing parameter) for the high energy multistage linear acceleration unit 14 and a source parameter, for example. The source parameter includes a control parameter for the ion source 10 and setting values for the extraction electrode 11. Examples of items of the control parameter for the ion source 10 are an arc current, an arc voltage, a source gas flow rate, and a source magnet current. The source magnet generates an electron confining magnetic field. Examples of the setting values for the extraction electrode 11 are an extraction gap distance, right and left positions of the electrodes, and electrode tilt.

The data set is determined so that the beam current amount to be measured may be equivalent to a target beam current amount. The acceleration parameter is determined so that the ions are accelerated to have the target energy in the high energy multistage linear acceleration unit 14, and so that a measured beam current amount is equivalent to the target beam current amount. The target energy and the target beam current amount are determined based on a given implantation condition. For example, the target energy and the target beam current amount may be equal to the energy and the beam current amount to be implanted into the wafer 40, respectively.

As shown in FIG. 6, in the preliminary preparation (S100), the controller first creates an initial data set (S102). The initial data set is a set of initial values for a data set to be determined based on an input new implantation condition. The controller can determine the initial data set with use of an appropriate arbitrary known method. For example, the controller determines the initial values of the acceleration parameters and the focusing/defocusing parameter with use of a method disclosed in JP 3448731 B1 as described above. The controller may store the input implantation condition and the determined parameter initial values in the parameter storage device 70 or another storage device.

The controller executes generation of a source beam (S104). That is, the controller starts an operation of the ion implanter 100 with use of the initial data set. The ion beam generation unit 12 and the high energy multistage linear acceleration unit 14 are activated, and the ion beam B is generated under the respective initial values of the source parameter, the acceleration parameter, and the focusing/defocusing parameter.

The controller switches the energy analysis slit 28 from the standard slit opening 110 to the high-precisions lit opening 112 (S106). In a case in which the energy analysis slit 28 has already been switched to the high-precision slit opening 112, the high-precision slit opening 112 is kept at the position. In this manner, the high-precision slit opening 112 is positioned in the horizontal direction to be arranged on the trajectory of the ion beam B.

The controller tunes the parameters included in the data set (S108). The controller may tune the source parameter, the acceleration parameter, and the focusing/defocusing parameter in a predetermined order. The controller may store the tuned parameters in the parameter storage device 70 each time of tuning.

Subsequently, the controller determines whether or not a peak beam current is obtained (S110). For example, the controller determines whether or not the beam current amount measured at the downstream of the energy analysis slit 28 reaches a certain threshold value. This threshold value is a smaller value than the target beam current amount to be defined in accordance with the target beam current amount, for example. The beam current is measured by the second beam measuring instrument 80b, for example. At this time, since the energy analysis slit 28 has been switched to the high-precision slit opening 112, the beam current of the ion beam B that has passed through the high-precision slit opening 112 is measured.

In a case in which the measured beam current is less than the threshold value (N in S110), the controller executes tuning of the data set again (S108) and determines again whether or not the peak beam current is obtained (S110).

In this manner, the controller can tune the respective parameters of the data set so that the beam current amount to be measured may be increased. In the first tuning step of the parameters, the controller tunes the respective parameters of the data set so that the beam current amount to be measured may be increased from an initial beam current amount. The initial beam current amount is a beam current amount measured with use of the high-precision slit opening 112 when the ion implanter 100 is operated in accordance with initial values of the parameters. In a subsequent, repetitive step of tuning the parameters, the controller retunes the respective parameters of the data set so that the beam current amount to be measured may be increased from a previously tuned beam current amount. The previously tuned beam current amount is a beam current amount measured with use of the high-precision slit opening 112 when the ion implanter 100 is operated in accordance with the parameters tuned in the previous tuning step.

For example, in the first tuning step of the acceleration parameters, the controller tunes the acceleration parameters so that the beam current amount to be measured is increased more than when the high energy multistage linear acceleration unit 14 is operated under an initial value for the acceleration parameter. Also, in a subsequent tuning step of the acceleration parameter, the controller retunes the acceleration parameter so that the beam current amount to be measured is increased more than when the high energy multistage linear acceleration unit 14 is operated under the previously tuned acceleration parameter. The controller tunes the source parameter and the focusing/defocusing parameter in similar manners.

In a case in which the beam current measured reaches the threshold value (Y in S110), the controller switches the energy analysis slit 28 from the high-precision slit opening 112 to the standard slit opening 110 (S112). The standard slit opening 110 is positioned in the horizontal direction so as to be arranged on the trajectory of the ion beam B. In this manner, the controller switches the energy analysis slit 28 after the parameter tuning (S108).

The controller determines whether or not the target beam current is obtained (S114). For example, the controller determines whether or not the beam current amount measured at the downstream of the energy analysis slit 28 reaches the target beam current amount. At this time, since the energy analysis slit 28 has been switched to the standard slit opening 110, the beam current of the ion beam B that has passed through the standard slit opening 110 is measured. The beam current is measured by the second beam measuring instrument 80b, for example.

In a case in which the beam current measured is less than the target beam current amount (N in S114), the controller switches the energy analysis slit 28 from the standard slit opening 110 to the high-precision slit opening 112 again (S106). Subsequently, as described above, the controller executes tuning of the parameters again (S108) and determines again whether or not the peak beam current is obtained (S110). In this manner, the controller repeats tuning of the parameters until the target beam current is obtained while switching the energy analysis slit 28 between the standard slit opening 110 and the high-precision slit opening 112.

In a case in which the beam current measured reaches the target beam current amount (Y in S114), the controller stores the tuned parameters in the parameter storage device 70 (S116). In particular, the controller stores the tuned acceleration parameter in the parameter storage device 70 as an optimal acceleration parameter for the input implantation condition (e.g., the implantation energy).

In this manner, the controller executes optimization processing of the parameters. That is, the controller progressively tunes the parameters, starting with initial values tentatively set based on a predetermined implantation condition, and updates the parameters to optimal values so that the ion beam satisfying the implantation condition is transported to the downstream of the beamline efficiently. For example, as for the acceleration parameter, the controller progressively tunes the acceleration parameter, starting with an initial value tentatively set based on the target energy, and updates the acceleration parameter to an optimal value so that the ions are accelerated efficiently to have the target energy in the high energy multistage linear acceleration unit 14.

Meanwhile, the controller may tune again at least one parameter out of the data set not only in a case in which the measured beam current is less than the aforementioned threshold value or the target beam current amount but also in a case in which the beam current is excessive. In this case, the controller preferably retunes a parameter other than the acceleration parameter. If the acceleration parameter is tuned again, this may lead to a disadvantageous result in which acceleration energy deviates from an optimal value obtained before the retuning because the retuning of the acceleration parameter can reduce the excess beam current easily. Under such circumstances, to reduce the beam current, the controller may retune the aforementioned source parameter. Alternatively, the controller may control a beam current adjuster for adjusting the ion beam amount to be incident into the radio frequency linear accelerator. This beam current adjuster may comprise a variable aperture (e.g., a continuously variable aperture (CVA)) arranged at the downstream of (e.g., immediately behind) the mass analysis slit 22b. The variable aperture may be arranged at the entrance of the radio frequency linear accelerator.

The method of tuning an ion beam described with reference to FIG. 6 is executed only once when a new implantation condition is given to the controller. However, the controller may correct the data set for a previously given implantation condition by means of this method after maintenance or repair of the ion implanter 100 (e.g., the high energy multistage linear acceleration unit 14).

Figure 7:
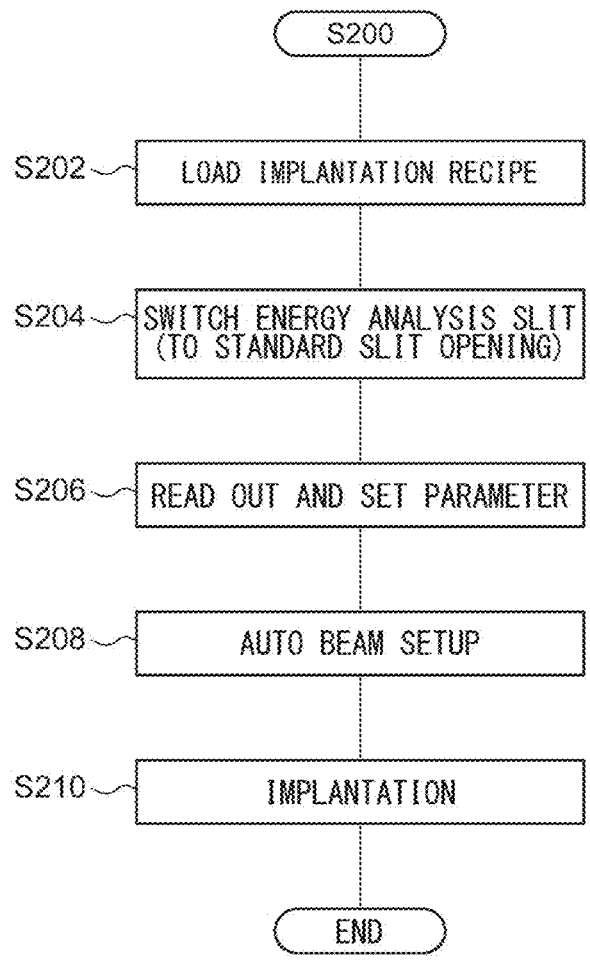
FIG. 7 is a flowchart illustrating an ion implantation method according to an embodiment of the present invention.

FIG. 7 is a flowchart illustrating an ion implantation method according to an embodiment of the present invention. This method corresponds to the actual operation (S200) shown in FIG. 5. The controller loads the implantation recipe (S202). That is, the controller reads out the implantation condition for implantation processing to be executed this time from the parameter storage device 70 or another storage device.

The controller switches the energy analysis slit 28 from the high-precision slit opening 112 to the standard slit opening 110 (S204). In a case in which the energy analysis slit 28 has already been switched to the standard slit opening 110, the standard slit opening 110 is kept at the position. In this manner, the standard slit opening 110 is positioned in the horizontal direction to be arranged on the trajectory of the ion beam B.

In the actual operation, the controller may prohibit switching of the energy analysis slit 28 from the standard slit opening 110 to the high-precision slit opening 112 from this point forward. The controller prohibits switching of the energy analysis slit 28 at least during the auto beam setup. Thus, in the auto beam setup and the following implantation processing, the standard slit opening 110 is used.

The controller reads out the data set corresponding to the loaded implantation recipe from the parameter storage device 70 and sets the respective units in the ion implanter 100 in accordance with the data set (S206). For example, the controller reads out an optimal acceleration parameter corresponding to the implantation energy in the read implantation condition from the parameter storage device 70 and sets this parameter to the high energy multistage linear acceleration unit 14.

The controller executes the auto beam setup (S208). By the auto beam setup, the ion beam B satisfying the read implantation condition is prepared.

This auto beam setup is processing of tuning the beam current amount by tuning at least one component of the ion implanter 100 other than the radio frequency resonator 14a. Specifically, the controller tunes the respective units of the ion implanter 100 to obtain a desired ion beam amount while monitoring the beam current. The beam current is measured by the second beam measuring instrument 80b or the third beam measuring instrument 80c, for example. In the auto beam setup, the controller tunes the control parameter for the ion source 10, the setting values for the extraction electrode 11, and/or the operation parameter for the focusing/defocusing lens 64, for example. This tuning does not influence the acceleration energy by the high energy multistage linear acceleration unit 14. Meanwhile, the auto beam setup may include beam angle tuning and/or uniformity tuning in addition to the beam current tuning.

The controller prohibits a change of the optimal acceleration parameter in the auto beam setup. Thus, during the auto beam setup and implantation processing, the high energy multistage linear acceleration unit 14 is operated in accordance with the optimal acceleration parameter determined in the preliminary preparation (S100).

When the auto beam setup is completed, the controller executes implantation processing into the wafer 40 (S210). One or a plurality of wafers 40 are transported into the ion implantation position of the vacuum processing chamber 21 by the wafer transportation device 90, and the wafer 40 is irradiated with the ion beam B. Thereafter, the wafer 40 is transported out of the vacuum processing chamber 21 by the wafer transportation device 90. Such implantation processing is repeated until as many wafers 40 as the required number are processed.

Subsequently, the controller may execute implantation processing using a different implantation condition. In this case, the different implantation condition is read out, and the ion beam B satisfying the implantation condition is prepared by the auto beam setup. The implantation processing is then executed. Under a certain implantation condition, the high-precision slit opening 112, not the standard slit opening 110, may be used. For example, in a case in which the energy width required in the certain implantation condition is smaller than the energy width achieved by the standard slit opening 110, the high-precision slit opening 112 may be used. In this case, before the auto beam setup is executed, the controller may switch the energy analysis slit 28 from the standard slit opening 110 to the high-precision slit opening 112. However, in a case in which the beam current amount falls below the target beam current amount in the certain implantation condition by using the high-precision slit opening 112, the standard slit opening 110, not the high-precision slit opening 112, may be used.

Figure 8:
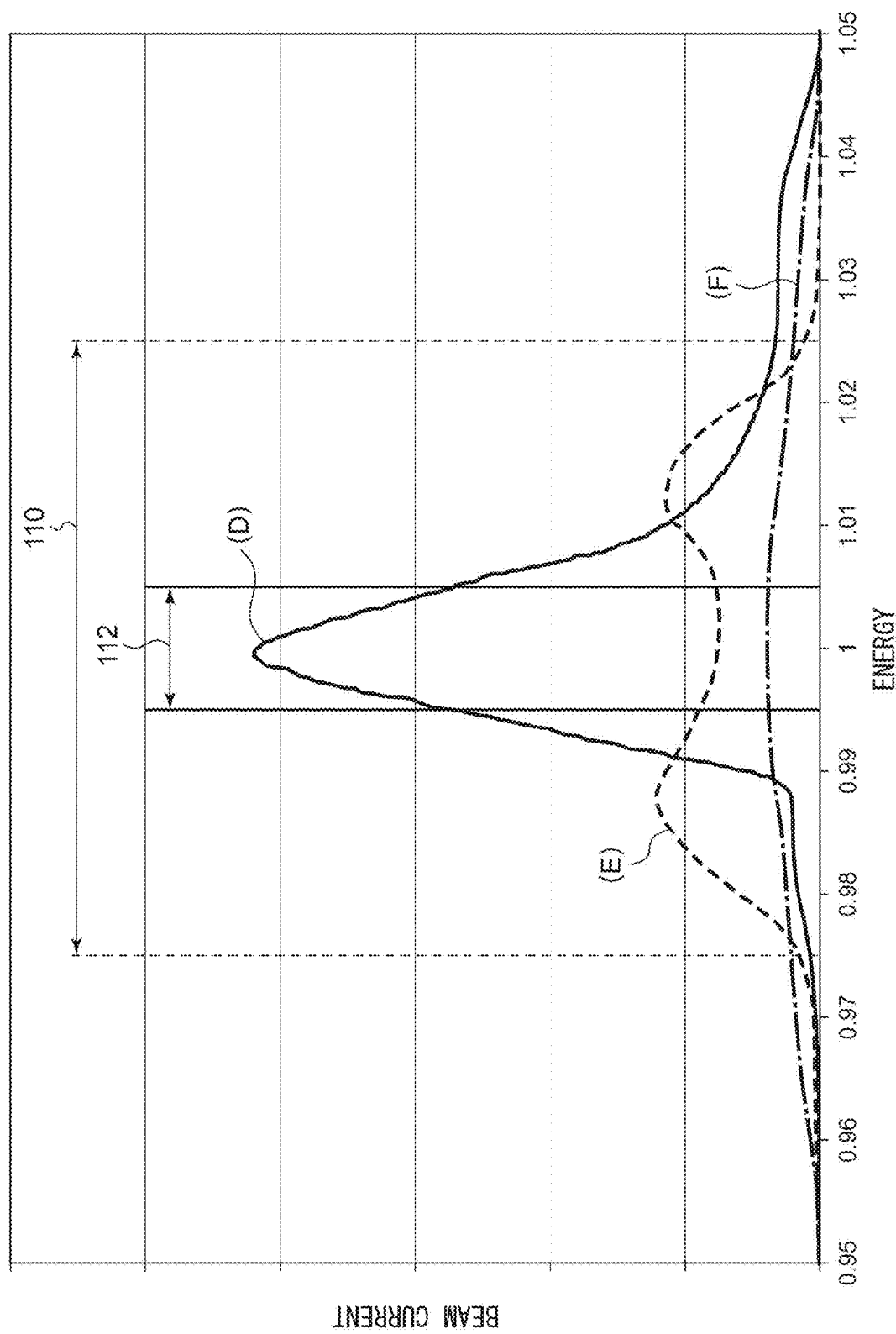
FIG. 8 illustrates an energy spectrum according to an embodiment of the present invention.

FIG. 8 illustrates an energy spectrum according to an embodiment of the present invention. In FIG. 8, beam current is expressed in the vertical axis while energy is expressed in the horizontal axis. The energy in the horizontal axis is a relative value to target energy of a translated energy value from a deflection magnetic field in the energy analysis magnet 24. Accordingly, an ideal ion beam having favorable energy precision exhibits an energy spectrum having a clear peak of the beam current when the energy value is 1.

An energy spectrum D shown in FIG. 8 is obtained when tuning of the acceleration parameter is executed with use of the high-precision slit opening 112. An energy spectrum E is obtained when tuning of the acceleration parameter is executed with use of the standard slit opening 110. An energy spectrum F is one before tuning of the acceleration parameter. For reference, FIG. 8 illustrates energy widths corresponding to the respective slit widths of the standard slit opening 110 and the high-precision slit opening 112 used.

As is apparent from the energy spectrum F, the ion beam before parameter tuning does not have a clear peak at the target energy and contains ions accelerated in a wide energy range. On the other hand, it is apparent from the energy spectra D and E that each of the corresponding ion beams contains more ions having the target energy or energy close to the target energy. However, in the energy spectrum E, the ion beam does not have a peak corresponding to the target energy but has a first peak on a lower side than the target energy and a second peak on a higher side than the target energy. Thus, the number of ions having energy corresponding to the target energy is relatively small. Each of the two peaks deviates from the target energy by approximately 1%. The ions with energy deviation will be implanted into the wafer 40 with an angle error depending on the deviation.

Conversely, the energy spectrum D has a single significant peak corresponding to the target energy. In this manner, the ion beam B with optimal energy precision and an optimal beam current amount can be obtained. Accordingly, by using the high-precision slit opening 112, it is possible to achieve improvement of energy precision while maintaining productivity of the ion implanter.

Energy resolution is improved in reverse proportion to reduction of the slit width. Thus, for example, in a case in which the high-precision slit opening 112 has a ⅕ slit width of the standard slit opening 110, the energy resolution is improved five times.

Also, as described above, switching of the energy analysis slit 28 is prohibited in the auto beam setup. This can prevent dust or particles that may be caused by slit switching, and also shorten time required for the auto beam setup further than in a case of performing switching.

Further, a change of the acceleration parameter is prohibited in the auto beam setup. This also contributes to shortening of time required for the auto beam setup further than in a case of tuning the acceleration parameter in the auto beam setup.

The acceleration parameter will be perfectly determined in principle if the high-precision slits are arranged both at the entrance and at the exit of the energy analysis magnet 24. However, a sufficient effect for a practical use can be obtained as shown in FIG. 8 by arranging the high-precision slit opening 112 only on the exit side of the energy analysis magnet 24.

Described above is an explanation based on the exemplary embodiments of the present invention. The invention is not limited to the above-mentioned embodiments, and various design modifications may be added. It will be obvious to those skilled in the art that such modifications are also within the scope of the present invention.

In an embodiment, a first upstream slit assembly may be arranged at the entrance of the energy analysis magnet 24 (i.e., the exit of the high energy multistage linear acceleration unit 14). The first upstream slit assembly may comprise a first upstream high-precision slit corresponding to the high-precision slit opening 112 and may be configured to be switchable in synchronization with switching of the energy analysis slit 28. For example, the controller may drive the first upstream slit assembly so that the first upstream high-precision slit is arranged on the trajectory of the ion beam B when the high-precision slit opening 112 is used, and so that the first upstream high-precision slit is moved to a position out of the trajectory of the ion beam B when the standard slit opening 110 is used. By doing so, precision can further be improved.

In an embodiment, a second upstream slit assembly may be provided in addition to or instead of the first upstream slit assembly. The second upstream slit assembly may be arranged at the upstream of the energy analysis slit 28 at the exit of the energy analysis magnet 24 and may be configured to be switchable in synchronization with switching of the energy analysis slit 28. The second upstream slit assembly may be the energy width confining slit 27. In this case, the energy width confining slit 27 may be configured to enable switching between a standard slit opening and a high-precision slit opening which is narrower in the horizontal direction in a similar manner to that of the energy analysis slit 28. By doing so, precision can further be improved.

In an embodiment, the energy analysis slit 28 may comprise a variable slit enabling switching from the standard slit opening 110 to the high-precision slit opening 112 and from the high-precision slit opening 112 to the standard slit opening 110. The variable slit may be a single slit enabling the slit width to be changed continuously.

The controller (or the control device) mentioned herein may be a single controller executing one or more functions mentioned as those to be executed by the controller, or a plurality of controllers executing such one or more functions in cooperation with each other. Thus, for example, the controller executing one or more functions mentioned herein may be achieved by a first controller executing a part of the functions and a second controller executing the rest of the functions.

In an embodiment, the energy width confining slit 27 and the energy analysis slit 28 may be arranged as described in detail below. The aforementioned energy analysis magnet 24, energy width confining slit 27, horizontal focusing quadrupole lens 26, and energy analysis slit 28 correspond to an energy analysis electromagnet, energy width confining slit, lateral convergence lens QR1, and energy analysis slit in the following description, respectively.

An ion implanter according to an embodiment includes: a beam extraction system that generates an ion beam by extracting ions generated by an ion source from a static electric field; a high-frequency accelerator that further accelerates the extracted ion beam; at least one convergence element that is used for adjusting the beam size (spatial distribution) of the accelerated beam; and at least one deflection electromagnet that is used as an energy analysis electromagnet. In addition, an energy width confining slit and an energy analysis slit are installed to the downstream side of the energy analysis electromagnet.

The convergence element used for adjusting the beam size (the spatial distribution of ions) is installed between the high-frequency accelerator and the energy analysis electromagnet and between the energy analysis electromagnet and the energy analysis slit and is adjusted such that a beam (a beam transported with energy as is extracted without applying a high-frequency electric field to the high-frequency accelerator) having no energy width is focused at the position of the energy slit.

The orbit of each ion configuring the ion beam having an energy width is caused to spatially spread within the deflection face in accordance with energy by the energy analysis electromagnet (energy dispersion). The energy width confining slit is disposed at a position at which the energy dispersion is of the same level as the beam size of a beam having no energy width on the upstream side of the energy analysis slit. The position is near the exit of the energy analysis electromagnet.

The energy analysis using the energy analysis electromagnet and two slits arranged as described above will be described below in detail for a case where there are two 90°-deflected electromagnets, and two slits are installed therebetween as an example.

The size σ (s) of the ion beam in the horizontal direction (the direction perpendicular to the beam axis) within a horizontal plane (deflection plane) for an arbitrary position (a path length from the start point of the beam line) s on the center axis of the beam line is provided in the following Equation (1).

[Equation 1]

$$\sigma(s) = \sqrt{\varepsilon \beta(s)} + \frac{1}{2}\left|\frac{\Delta_{EW}}{E}\eta(s)\right| \quad (1)$$

Here, $\varepsilon$ is the emittance of the beam, E is beam energy, and $\Delta_{EW}$ is an energy width. In addition, $\beta(s)$ is called a betatron function (amplitude) and is a solution of the beam transportation equation. Furthermore, η(s) is called an energy dispersion function and is a solution of the energy-shifted beam transportation equation.

Individual ions inside the ion beam extracted from the ion source have positions and a distribution of angles with respect to the beam (a group of all the ions) center axis. Here, a graph having distances of individual ions from the beam center axis on the horizontal axis and angles formed by the traveling direction vectors of individual ions and the beam center axis on the vertical axis is called a phase space plot. The product (an area occupied by the beam in the phase space) of the distribution range of positions and the distribution range of angles is called emittance, and, when the emittance is normalized with respect to the momentum, it is a constant amount that does not change from the extraction port of the ion source to the end edge of the beam transmission path.

[Equation 2]

$$\sigma_1 = \sqrt{\epsilon\beta} \quad (2)$$

The first term of Equation (1) described above as represented in Equation (2) is a beam width $\sigma_1$ formed by the initial ion distribution and, hereinafter, the beam width $\sigma_1$ will be referred to as a "beamwidth according to the emittance". While the emittance is defined independently in the horizontal direction and in the vertical direction, only the horizontal direction is of significance here, and, hereinafter, unless otherwise noted, the emittance $\epsilon$ represents the emittance of the horizontal direction.

As described above, in addition to the spread of the beam according to the spatial distribution, the beam accelerated by the high-frequency linear acceleration device has an energy distribution (width). When the beam having the energy distribution (width) passes through the deflection electromagnet, an ion having relatively high energy follows an outer orbit having a large radius of curvature, and an ion having relatively low energy follows an inner orbit having a small radius of curvature. Accordingly, the beam is incident to the deflection electromagnet as one point (no spatial distribution), a spatial distribution (horizontal distribution) according to the energy width is generated at the exit.

[Equation 3]

$$\sigma_2 = \frac{1}{2}\left|\frac{\Delta_{EW}}{E}\eta\right| \quad (3)$$

The second term of Equation (1) represented in Equation (3) represents a spatial distribution generated as the energy distribution changes. Hereinafter, a phenomenon in which the energy distribution changes to a spatial distribution in accordance with the deflection will be referred to as an energy distribution, and the beam width $\sigma_2$ generated as a result thereof will be referred to as a beam width according to the energy distribution or simply as dispersion. Equation (1) represents that the beam size is a sum of a beam width according to the emittance and a beam width according to the energy dispersion.

In the invention of the present application, while two slits including the energy width confining slit and the energy analysis slit are used, first, the distribution of the beam in an area from the energy analysis electromagnet to the energy analysis slit will be described in accordance with a conventional method in which a beam is cut using one energy analysis slit as an example.

Figure 9:
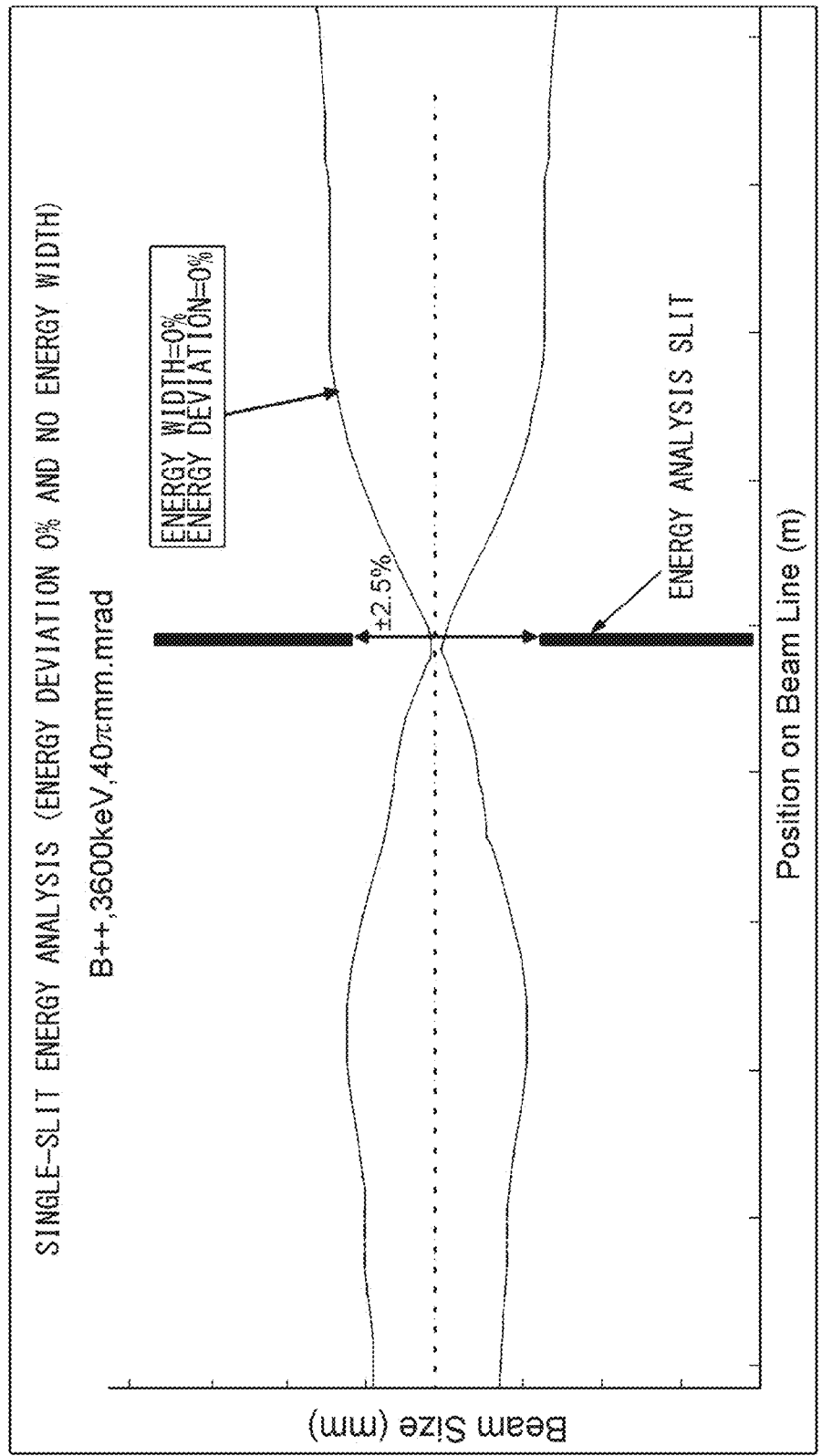
FIG. 9 is a schematic view illustrating the appearance of a beam having an energy width of 0% and a center energy deviation of 0% passing through one energy analysis slit that is placed near the focal point.

FIG. 9 is a schematic view illustrating the appearance of a beam having an energy width of 0% and a center energy deviation of 0% passing through one energy analysis slit that is placed near the focal point.

Figure 10:
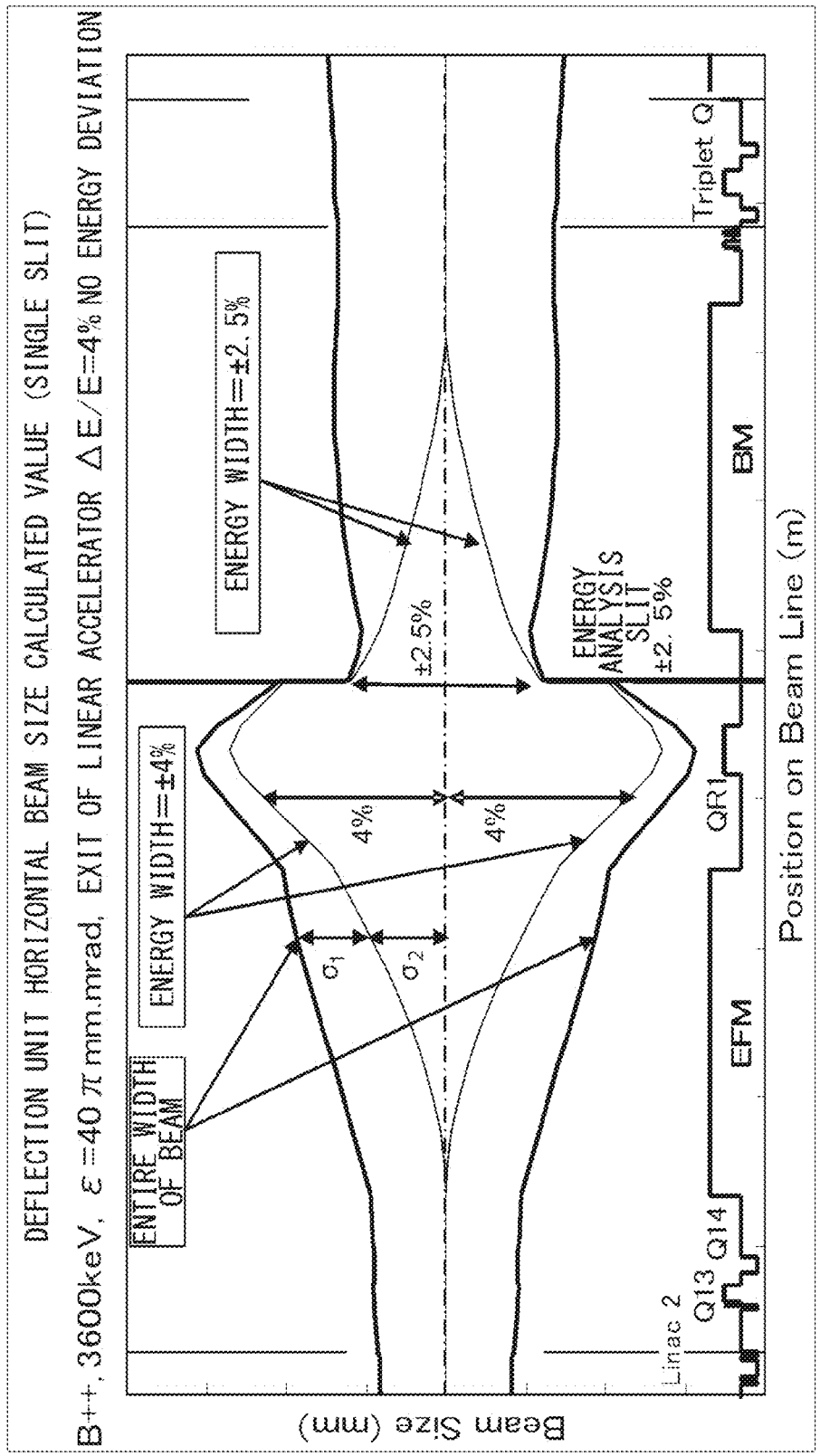
FIG. 10 is a schematic view illustrating the appearance of changing a beam originally having an energy width of ±4% into a beam having an energy width of ±2.5% by being cut by one energy analysis slit using a deflection unit.

FIG. 10 is a schematic view illustrating the appearance of changing a beam originally having an energy width of ±4% into a beam having an energy width of ±2.5% by being cut by one energy analysis slit using a deflection unit. The horizontal axis represents the path distance of an ion from the exit of the ion source, and the vertical axis represents the width of the beam and the opening width of each slit. Right above the horizontal axis, the positions of the energy analysis electromagnet (EFM), the deflection electromagnet (BM), and the like are illustrated.

Figure 11:
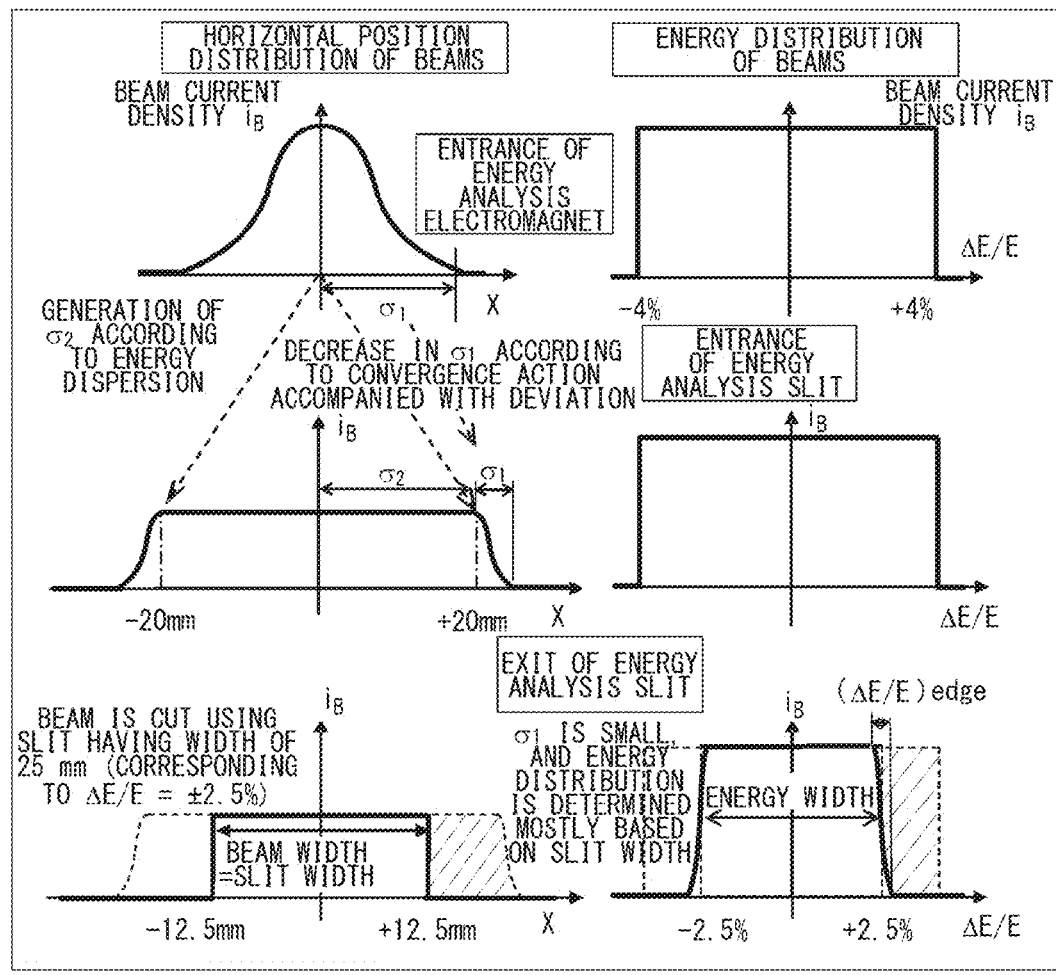
FIG. 11 is a diagram illustrating energy distributions corresponding to horizontal spatial distributions of beams at an entrance (near 5.6 m) of an energy analysis electromagnet (EFM) illustrated in FIG. 10 and an entrance and an exit (near 7.4 m) of the energy analysis slit.

FIG. 11 is a diagram illustrating energy distributions corresponding to horizontal spatial distributions of beams at an entrance (near 5.6 m) of an energy analysis electromagnet (EFM) illustrated in FIG. 10 and an entrance and an exit (near 7.4 m) of the energy analysis slit. The horizontal axis of the spatial distribution is a horizontal distance from the designed center orbit, and the horizontal axis of the energy distribution is a value acquired by dividing a difference from expected injection energy by the expected injection energy. The vertical axis is a beam current density (a number density of ions passing per unit time) for any of the distributions. The energy analysis slit is installed to a position at which the beam width according to the emittance is minimum.

The spatial distribution at the entrance of the energy analysis electromagnet (EFM) is assumed to be a distribution close to the Gauss type, and the energy distribution is assumed to be a uniform distribution. When the beam enters the EFM, and the dispersion starts, the horizontal spatial distribution is prolonged and spreads. The deflection electromagnet has a function for causing the beam width to converge (decrease β) according to the emittance together with an action for generating dispersion. Accordingly, the beam width $\sigma_2$ according to the dispersion represented in Equation (3) steadily increases, and the beam width $\sigma_1$ represented in Equation (2) steadily decreases, whereby the end portion of the horizontal spatial distribution is sharpened. Therebetween, the energy distribution does not change.

Between the EFM and the BM, a lateral convergence lens QR1 is inserted. This lens has a function for causing the ion beam to face the reduction direction by stopping the spread of the energy dispersion and promoting a decrease in the beam width $\sigma_1$ according to the emittance. Since the energy analysis slit is installed to a position at which the beam width $\sigma_1$ is minimum, the installation position moves to the EFM side in accordance with the effect of the lateral convergence lens QR1, whereby the space can be saved. The beam width $\sigma_2$ according to the energy dispersion is maximum near the center of the lateral convergence lens QR1. If there is no lateral convergence lens QR1, the spread of the dispersion continues to a position near the exit of the BM.

At the entrance of the energy analysis slit, the beam width $\sigma_2$ is extremely large, and the beam width $\sigma_1$ is minimum (the beam widths are adjusted as such by the lateral convergence lens QR1 and the convergence element disposed at the exit of the high-frequency accelerator). Accordingly, the end portion of the horizontal spatial distribution is very sharp, and the spatial distribution has a shape (uniform distribution) close to the energy distribution as a whole.

This beam is spatially cut by the energy analysis slit. First, the general change in the shape of the energy distribution in accordance with the spatial cut will be described. This part is very important as a principle supporting the invention of the present application.

When the energy distribution is a rectangular distribution (uniform distribution), and the beam width $\sigma_2$ is sufficiently larger than the beam width $\sigma_1$ according to the emittance and is sufficiently larger than the slit width $W_A$, the spatial distribution after the cut is a completely rectangular shape (uniform shape). At this time, the energy distribution is also cut to have the energy width according to the slit width. The energy width is as represented in Equation (4) based on Equation (3).

[Equation 4]

$$\frac{\Delta_{EW}}{E} = \pm \frac{W_A}{\eta} \quad (4)$$

However, the energy distribution that has been cut, different from the spatial distribution, is not a completely rectangular distribution. The reason for this is that both end portions of the energy distribution that has been cut does not include energy of the energy width corresponding to the beam width $\sigma_1$ according to the emittance. When the energy width corresponding to the beam width $\sigma_1$ is $\Delta E_{edge}/E$, the energy width is acquired as Equation (5) similar to Equation (4).

[Equation 5]

$$\frac{\Delta E_{edge}}{E} = \pm \frac{2\sigma_1}{\eta} \quad (5)$$

In the range of the energy distribution end portions that is given in Equation (5), the beam current density changes from a value of the rectangular distribution toward zero.

In other words, the energy distribution of the beam that has been spatially cut into a rectangular distribution by the slit has a shape in which the beam current density rises from zero to a value before the cut in the section of $-W_A/\eta - 2\sigma_1/\eta$ to $-W_A/\eta + 2\sigma_1/\eta$, is constant (the value before the cut) in the section of $-W_A/\eta + 2\sigma_1/\eta$ to $+W_A/\eta - 2\sigma_1/\eta$, and falls to zero in the section of $+W_A/\eta - 2\sigma_1/\eta$ to $+W_A/\eta + 2\sigma_1/\eta$. Thus, the effective width has a value represented in Equation (4).

In this way, generally, the shapes of the horizontal spatial distribution and the energy distribution change before and behind the slit, and the energy distribution is not in the shape of a rectangle. However, as in the example illustrated in FIG. 11, in a case where the beam is cut by placing one energy analysis slit at the position of the focal point of the beam, the beam width $\sigma_1$ is sufficiently smaller than the slit width $W_A$ ($W_A$=25 mm and $\sigma_1$=0.6 mm), and the energy distribution that has been cut can be regarded as an approximately rectangular shape.

Figure 12:
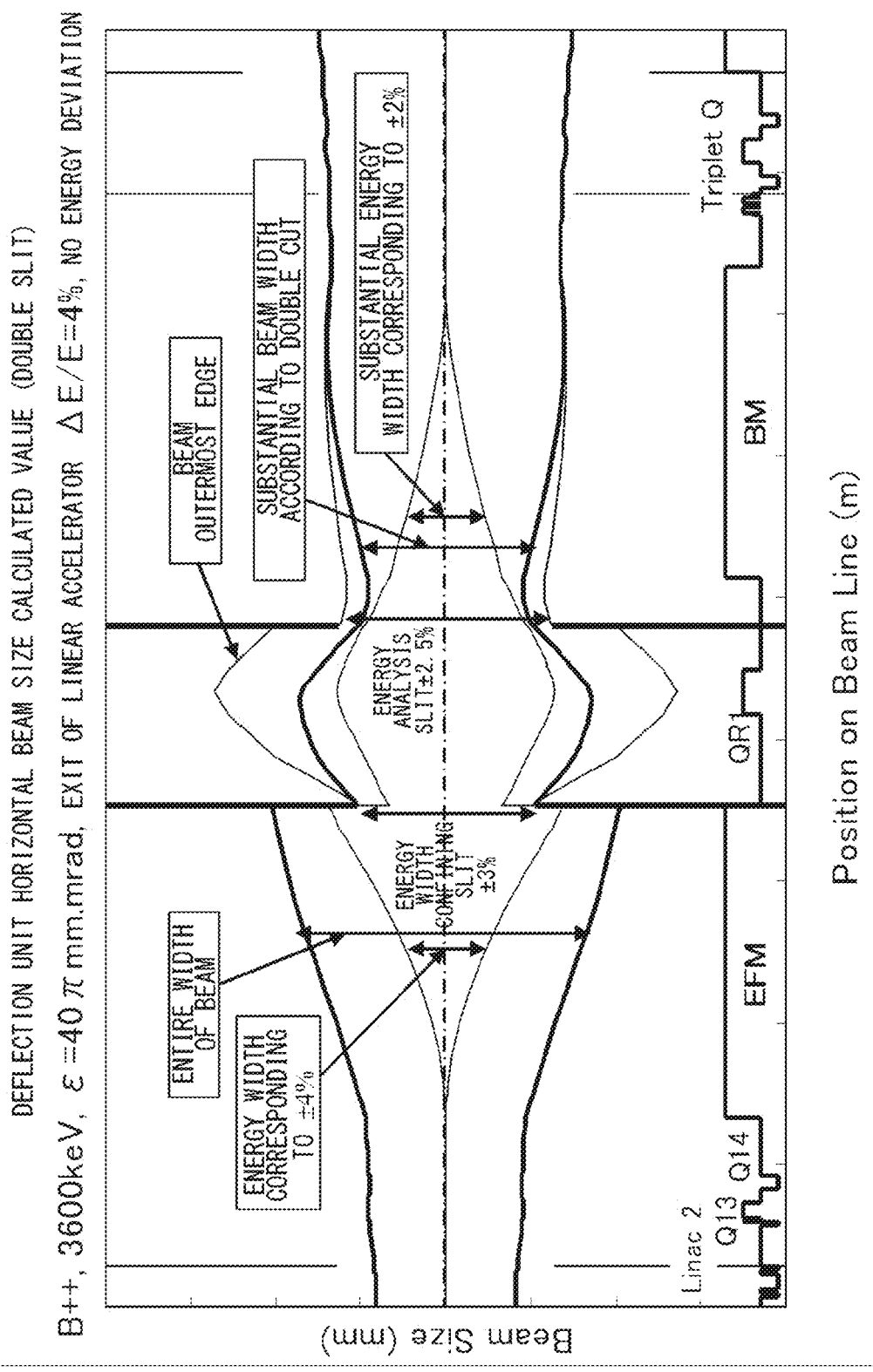
FIG. 12 is a schematic view illustrating the appearance of changing a beam originally having an energy width of ±4% into a beam having an energy width of ±2.5% by being cut by one energy analysis slit using a deflection unit including an energy width confining slit and an energy analysis slit.
Figure 13:
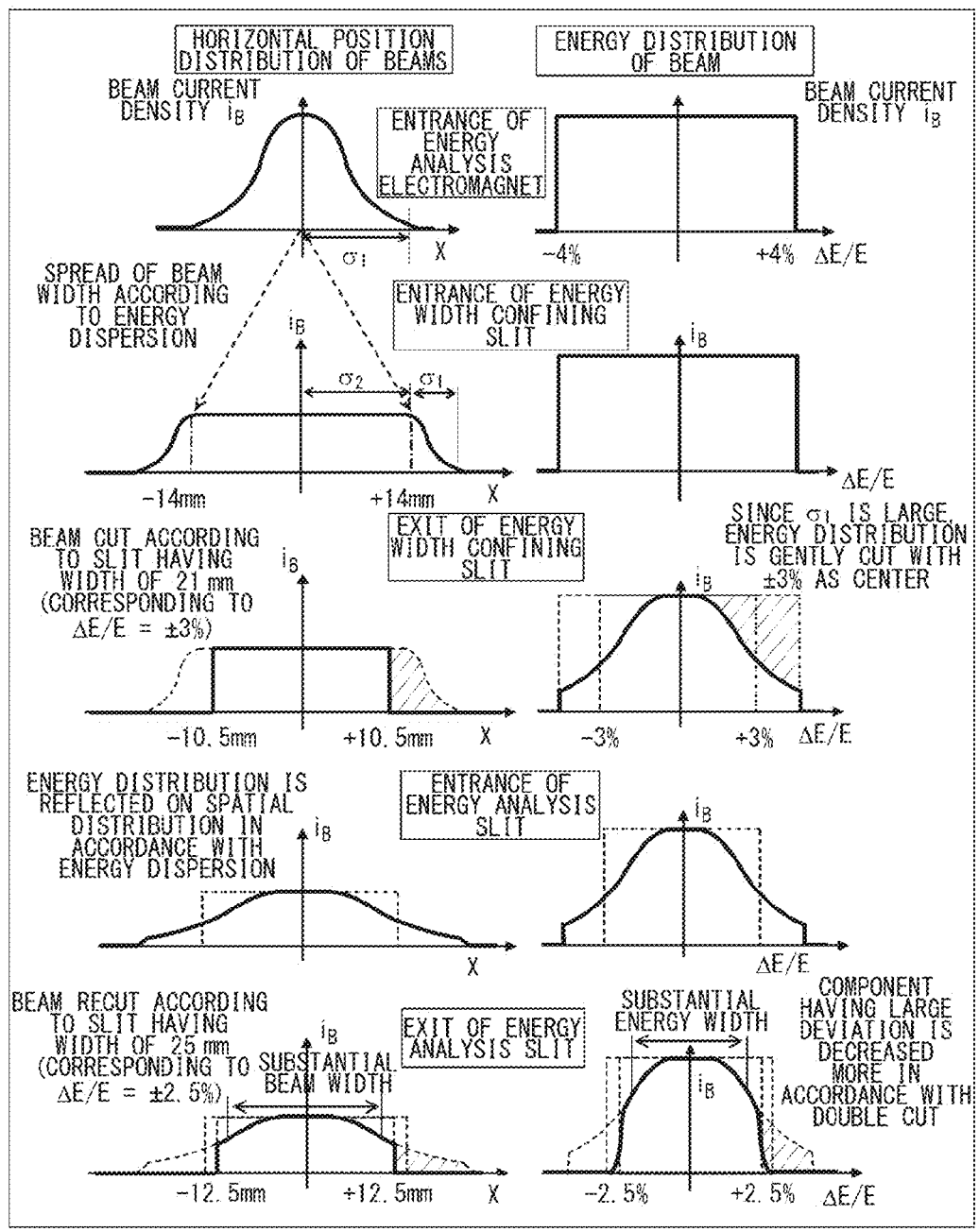
FIG. 13 is a diagram illustrating energy distributions corresponding to horizontal spatial distributions of beams at the entrance of the energy analysis electromagnet (EFM) illustrated in FIG. 12, an entrance and an exit of the energy width confining slit, and the entrance and the exit of the energy analysis slit.

FIG. 12 is a schematic view illustrating the appearance of changing a beam originally having an energy width of ±4% into a beam having an energy width of ±2.5% by being cut by one energy analysis slit using a deflection unit including an energy width confining slit and an energy analysis slit. FIG. 13 is a diagram illustrating energy distributions corresponding to horizontal spatial distributions of beams at the entrance of the energy analysis electromagnet (EFM) illustrated in FIG. 12, an entrance and an exit of the energy width confining slit, and the entrance and the exit of the energy analysis slit.

Near the exit of the EFM, while the beam width $\sigma_2$ according to the energy dispersion increases toward the maximum value, and the beam size $\sigma_1$ according to the emittance decreases toward the minimum value, and the beam width $\sigma_2$ is larger than the beam size $\sigma_1$, however, the beam size $\sigma_1$ is still quite large. Here, when the beam is cut by placing the energy width confining slit, the spatial distribution is temporarily a rectangular distribution. However, at that time, the effect of dulling the edge represented in Equation (5) is high, and the energy distribution is a gentle distribution far off a rectangular shape.

Even when the opening width of the energy width confining slit, for example, is set to a value corresponding to the energy width of 3%, the beam width $\sigma_1$ according to the emittance is large, and accordingly, many ions each having an energy difference of 3% or more from the expected injection energy pass. In accordance with the increase in the dispersion, the orbits of ions having energy that are shifted much steadily become far from the center, and, as a result, the beam size including the beam outer edge is quite large. For example, as in the case illustrated in FIG. 13, when the energy width of the beam output from the high-frequency accelerator is 4%, and a sum of the energy widths represented in Equations (4) and (5) calculated at the position of the energy width confining slit exceeds 4%, the beam size including the outer edge is the same as that of a case where there is no energy width confining slit. However, in accordance with the spread due to the cut and the dispersion according to the slit, the ion density of the outer edge portion is very low. As above, a portion of the beam outer edge, which is not cut by the slit, having a low density is called a halo.

In order to remove such a halo of the beam and settle the energy, the energy analysis slit is necessary at the position at which the beam width $\sigma_1$ is the minimum. As is illustrated in the last part of FIG. 13, even when the original energy distribution is a rectangular distribution, the energy distribution of the beam to which double filters are applied using the energy width confining slit and the energy analysis slit changes to a dome-shaped distribution. Accordingly, the effective energy width can be configured to be decreased by an amount corresponding to a relative increase in the density of the beam current of the center portion. In addition, generally, the energy distribution of the ion beam output from the high-frequency linear accelerator is originally in a dome shape, and accordingly, the effect of a decrease in the energy width further increases.

In addition, the double slit, in addition to the function for decreasing in the energy width, has a function for decreasing a center energy deviation for a beam having a slight center energy deviation.

Figure 14:
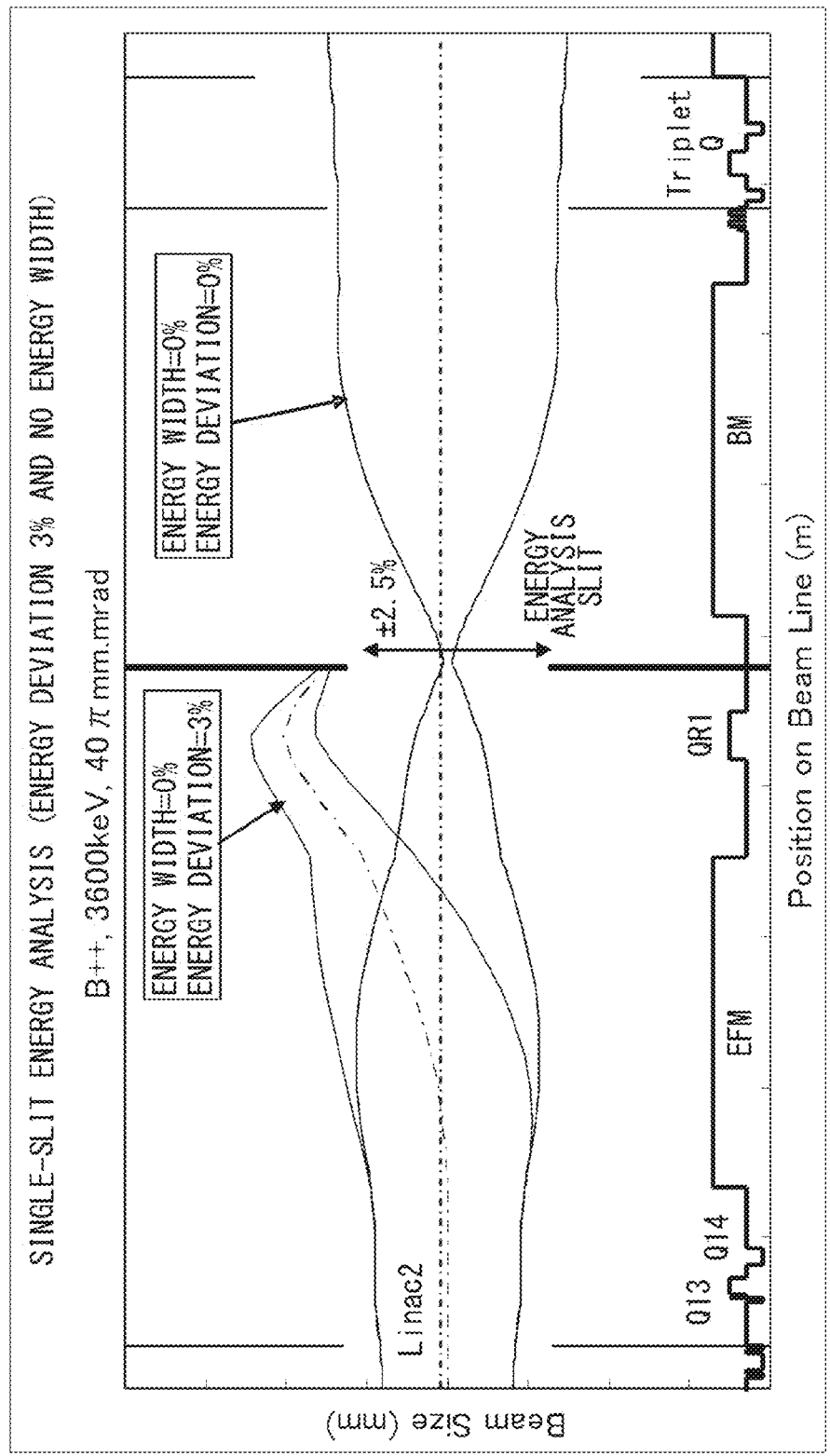
FIG. 14 is a schematic view illustrating the appearance of a beam having an energy width of 0% and a center energy deviation of 3% passing through an energy width confining slit and an energy analysis slit.

FIG. 14 is a schematic view illustrating the appearance of a beam having an energy width of 0% and a center energy deviation of 3% passing through the energy width confining slit and the energy analysis slit. As illustrated in FIG. 14, in the energy analysis of a beam (for example, 90 keV±0.000 in the case of set acceleration energy of 90 keV) having no energy width, a beam (for example, 92.7 keV in a case where the center energy deviation is +3%) having a center energy deviation that is defined as the opening width of the energy analysis slit or more is completely excluded. In such a case, by simply decreasing the opening width of the slit, the energy precision can be raised.

Even for a beam (for example, in a case where the set acceleration energy is 3 MeV, and the energy width is ±3%, the distribution range is 2.91 MeV to 3.09 MeV) having an energy width, by narrowing the energy analysis slit, while the energy precision is raised, however, most of the beam is wasted, and the value of the beam current that can be used is markedly lowered, whereby the production capability markedly lowered.

Thus, a technology for decreasing the center energy deviation (shift) with the slit width of the energy analysis slit being maintained to be large is required. As described above, this can be realized by inserting the energy width confining slit at a position at which the beam width according to the emittance is not negligibly large with respect to the beam width according to the energy dispersion.

Figure 15:
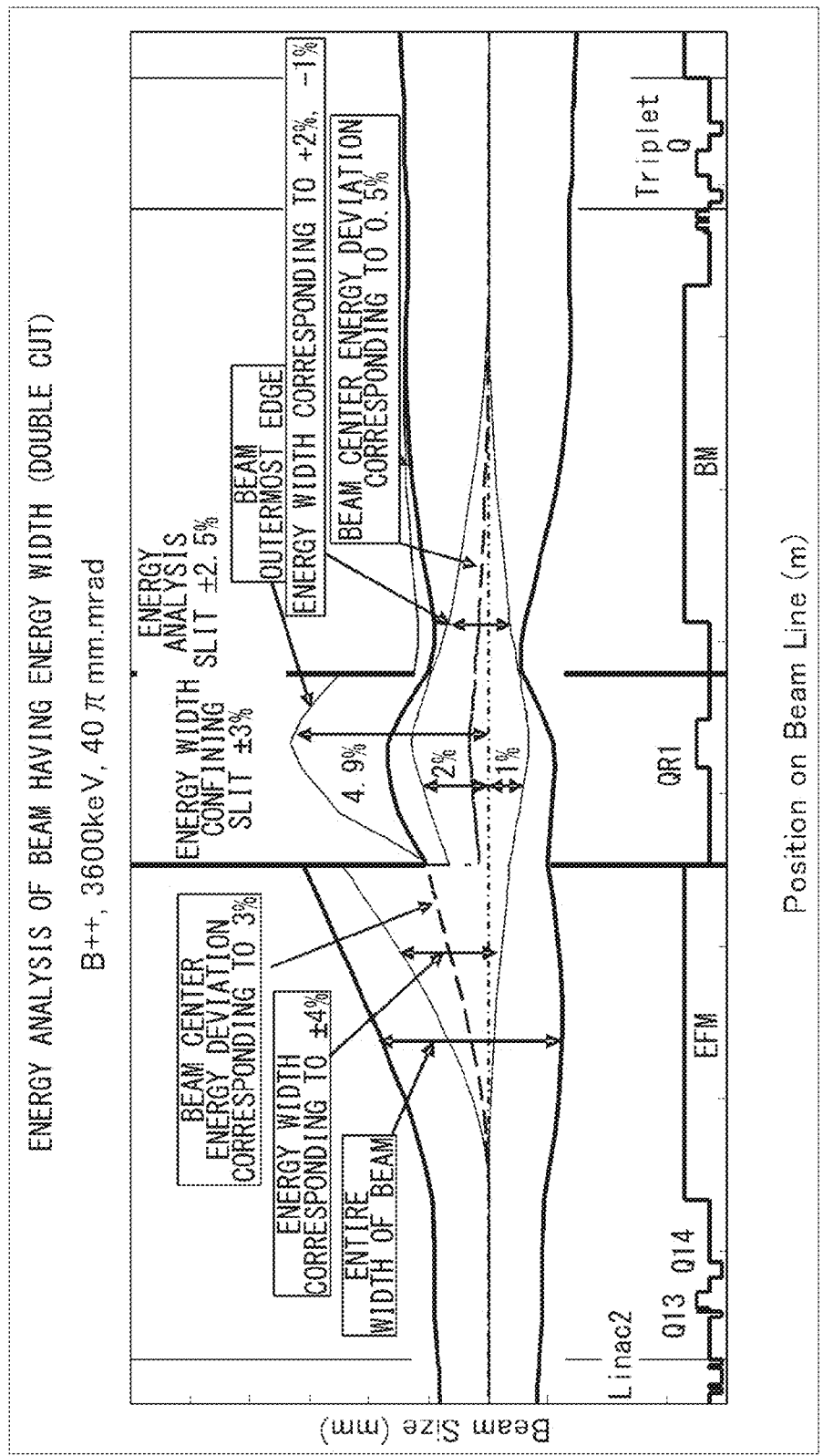
FIG. 15 is a schematic view illustrating the appearance of shaping a beam having an energy width of ±4% and a center energy deviation of +3%.
Figure 16:
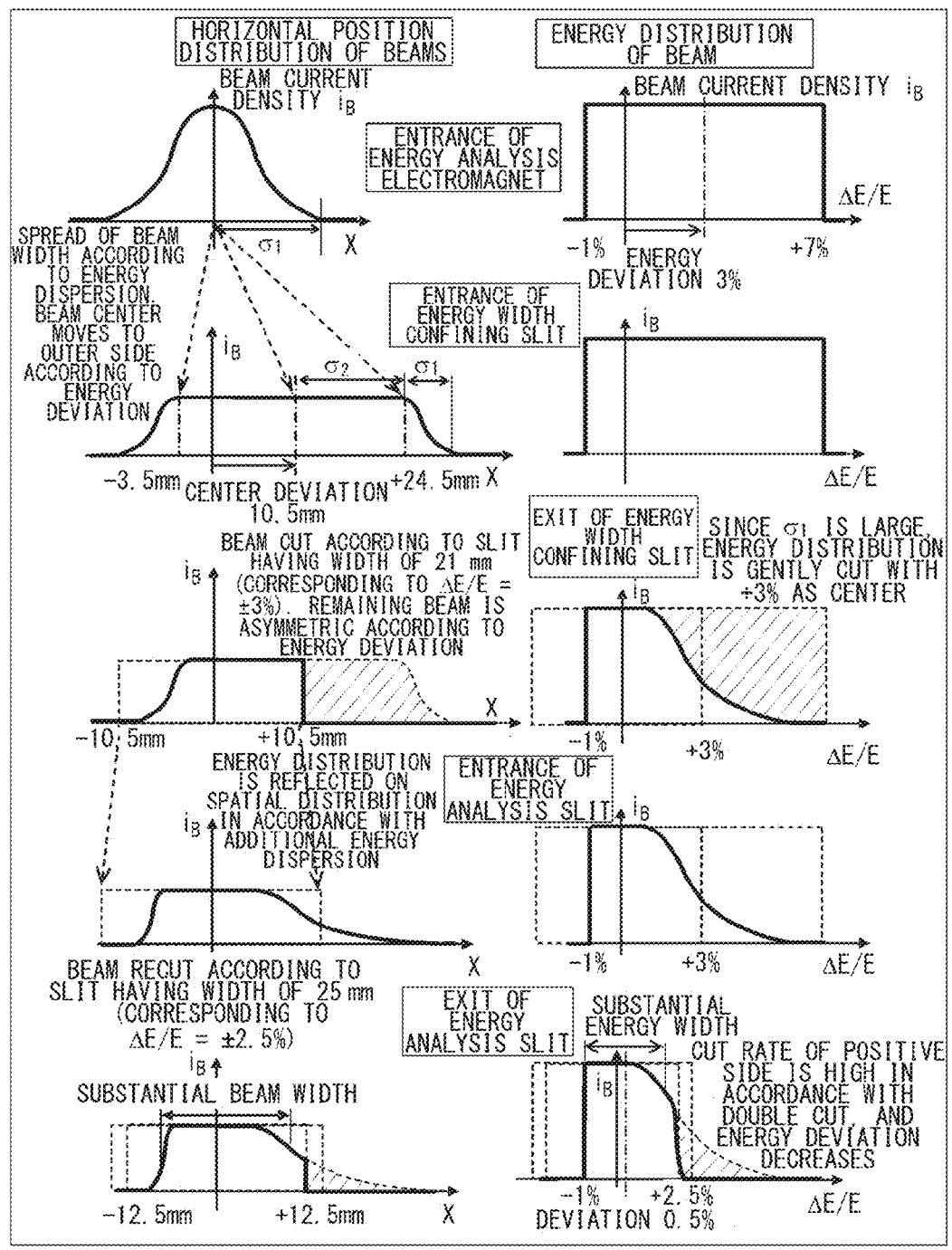
FIG. 16 is a diagram illustrating energy distributions corresponding to horizontal spatial distributions of beams at the entrance of the energy analysis electromagnet (EFM) illustrated in FIG. 15, the entrance and the exit of the energy width confining slit, and the entrance and the exit of the energy analysis slit.

FIG. 15 is a schematic view illustrating the appearance of shaping a beam having an energy width of ±4% and a center energy deviation of +3%. FIG. 16 is a diagram illustrating energy distributions corresponding to horizontal spatial distributions of beams at the entrance of the energy analysis electromagnet (EFM) illustrated in FIG. 15 and the entrance and the exit of the energy analysis slit.

As illustrated in FIGS. 15 and 16, the appearance of shaping the beam of an energy width of ±4% and a center energy deviation of +3% is illustrated. When the energy width confining slit having a slit width corresponding to an energy width of ±3% is attached near the exit of the EFM, the allowed energy range is −1% to +3% of the expected injection energy.

In such a case, when the width of the energy analysis slit corresponds to ±1% or more, ions (−1% to 0%) having energy lower than the expected injection energy pass through both the two slits. Accordingly, the energy distribution also has the original shape on the negative side, and, in the case of a rectangular distribution, the rectangular distribution is arrived at a wafer as it is.

For ions having energy higher than the expected injection energy, the energy distribution is shaped to be completely the same as that shaped by the double slit of a case where there is the above-described energy width, and there is no center energy deviation. Since the rectangular energy distribution is shaped into a (semi) dome-shaped distribution, the center of the distribution moves more to the side of the origin than that of the case of the rectangular distribution. In other words, the energy center of the beam after passing through the energy analysis slit is further close to the expected injection energy. For example, when the width of the energy analysis slit is set to be in correspondence with an energy width of ±2.5%, the center energy deviation that is originally 3% becomes 0.5% or less.

In a case where the original energy distribution is closer to a distribution of the Gauss type than to a rectangular (uniform) distribution, the effect of correcting the energy center using the energy width confining slit becomes higher.

In this way, in order to increase the energy precision by reducing one or both of the energy width and the energy center deviation of a beam accelerated by an acceleration system that has an energy width (energy distribution) of about a maximum of several % with respect to the set beam energy and a possibility of the center energy deviation, energy confinement using a double slit installed at a position at which the beam size according to the energy dispersion and the beam size according to the emittance are appropriately controlled is effective.

As an operating method of the energy analysis electromagnet used for excluding ions having shifted energy, a method is employed in which a magnetic field is fixed to a value corresponding to a specific energy level. Between the magnetic field (magnetic flux density) B [T] of the analysis electromagnet and the energy E [keV] of an ion, the following strict relation is formed.

Equation (6)

$$E = 4.824265 \times 10^4 \times (B^2 \cdot r^2 \cdot n^2)/m \qquad (6)$$

Here, m [amu] is a mass number of the ion, n is an electronic valence of the ion, and r [m] is the radius of curvature of the beam center orbit inside the electromagnet (this is called the radius of curvature of the deflection electromagnet). Among these, m and n are fixed values determined based on the injection condition, and r is a fixed value determined at the time of designing the electromagnet. Accordingly, operating the magnetic field B to be fixed means specifying the ion energy E.

By installing the energy width confining slit and the energy analysis slit so that only ions passing near the center of the magnet pole can pass, only ions having a specific energy level passes through the analysis slit. On the other hand, ions having energy deviating from the reference value by a constant value or more collide with the wall of this slit so as to be excluded from the beam line.

In a case where the energy of the original beam slightly deviates (shifted), and the beam current is insufficient, the energy is corrected by finely adjusting the acceleration phase or the acceleration voltage of the linear accelerator, thereby increasing the beam current. In order to adjust the beam current value (beam center orbit position), the magnet field of the energy analysis electromagnet does not need to be finely adjusted.

The deflection electromagnet used as the energy analysis electromagnet has an important role of determining the injection energy of the ion beam based on the value of the magnetic field. Accordingly, the magnetic field needs to be precisely set and be uniformly distributed. This is realized by producing the electromagnet having a pole face parallelization degree of ±50 μm and suppressing the magnetic field non-uniformity to be ±0.01% or less.

In this way, by arranging the energy analysis electromagnet, the energy width confining slit, and the energy analysis slit, high energy precision can be protected for a beam, which has an energy width, accelerated by the linear accelerator.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
    a radio frequency linear accelerator that accelerates supplied ions in accordance with an acceleration parameter;
    an energy analysis magnet that is arranged downstream of the radio frequency linear accelerator;
    an energy analysis slit assembly that is arranged downstream of the energy analysis magnet;
    a beam measurement unit that measures a beam current amount at a downstream of the energy analysis slit assembly; and
    a controller that determines the acceleration parameter for a predetermined implantation condition,
    wherein the acceleration parameter is determined so that at least a part of the supplied ions is accelerated to have target energy, and so that the beam current amount measured by the beam measurement unit is equivalent to a target beam current amount,
    wherein the energy analysis slit assembly is configured to enable switching between a standard slit opening used for implantation processing performed under the predetermined implantation condition and a high-precision slit opening having higher energy precision than the standard slit opening and used to tune the acceleration parameter.

2. The ion implanter according to claim 1, wherein the standard slit opening has a first slit width in a horizontal direction perpendicular to a beam traveling direction, wherein the high-precision slit opening has a second slit width that is narrower than the first slit width in the horizontal direction.

3. The ion implanter according to claim 2, wherein the energy analysis magnet generates a magnetic field in a vertical direction to deflect the ions exiting from the radio frequency linear accelerator,
wherein the vertical direction is perpendicular to the beam traveling direction and the horizontal direction.

4. The ion implanter according to claim 2, wherein either the standard slit opening or the high-precision slit opening is, in use, positioned at a position in the horizontal direction to pass the ions having the target energy therethrough.

5. The ion implanter according to claim 1, wherein the high-precision slit opening is formed separately from the standard slit opening,
wherein the energy analysis slit assembly is configured to enable selection between the standard slit opening and the high-precision slit opening.

6. The ion implanter according to claim 1, wherein the energy analysis slit assembly comprises a variable slit enabling switching from the standard slit opening to the high-precision slit opening and from the high-precision slit opening to the standard slit opening.

7. The ion implanter according to claim 1, wherein the controller stores the determined acceleration parameter in a storage device as an optimal acceleration parameter for the predetermined implantation condition.

8. The ion implanter according to claim 7, wherein the controller reads out the optimal acceleration parameter from the storage device and sets the optimal acceleration parameter to the radio frequency linear accelerator to execute the implantation processing.

9. The ion implanter according to claim 7, wherein the radio frequency linear accelerator comprises one or more radio frequency resonators,
wherein the controller executes an auto beam setup, in which the beam current amount is tuned by tuning at least one component of the ion implanter other than the radio frequency resonators, when the radio frequency linear accelerator is operated with the optimal acceleration parameter.

10. The ion implanter according to claim 9, wherein the controller prohibits switching of the energy analysis slit assembly from the standard slit opening to the high-precision slit opening in the auto beam setup.

11. The ion implanter according to claim 9, wherein the controller prohibits a change of the optimal acceleration parameter in the auto beam setup.

12. The ion implanter according to claim 1, wherein the controller measures the beam current amount by the beam measurement unit with use of the high-precision slit opening,
wherein the controller tunes the acceleration parameter so that the beam current amount to be measured is increased more than when the radio frequency linear accelerator is operated in accordance with an initial value of the acceleration parameter.

13. The ion implanter according to claim 12, wherein the controller switches the energy analysis slit assembly from the high-precision slit opening to the standard slit opening after tuning of the acceleration parameter,
wherein the controller measures the beam current amount by the beam measurement unit with use of the standard slit opening during operation of the radio frequency linear accelerator in accordance with the tuned acceleration parameter,
wherein the controller determines whether or not the measured beam current amount is equivalent to the target beam current amount.

14. The ion implanter according to claim 13, wherein the controller stores the tuned acceleration parameter in a storage device as an optimal acceleration parameter for the predetermined implantation condition if the beam current amount measured with use of the standard slit opening is equivalent to the target beam current amount.

15. The ion implanter according to claim 13, wherein the controller retunes the acceleration parameter with use of the high-precision slit opening if the beam current amount measured with use of the standard slit opening is not equivalent to the target beam current amount.

16. The ion implanter according to claim 12, wherein the controller creates the initial value of the acceleration parameter based on the predetermined implantation condition.

17. The ion implanter according to claim 1, further comprising a processing chamber in which a workpiece is irradiated with an ion beam in the implantation processing,
wherein the controller determines the acceleration parameter before a transportation container, which is arranged to transport the workpiece between the ion implanter and another device, is attached to the ion implanter to enable the workpiece to be transported into the processing chamber from the transportation container.

18. The ion implanter according to claim 17, wherein the controller executes the implantation processing with use of the standard slit opening after the transportation container is attached to the ion implanter.

19. The ion implanter according to claim 1, further comprising an upstream slit assembly that is arranged at an entrance and/or an exit of the energy analysis magnet and that is configured to be switchable in synchronization with switching of the energy analysis slit assembly.

20. The ion implanter according to claim 1, wherein the controller switches the energy analysis slit assembly to the high-precision slit opening for other implantation processing using a different implantation condition from the predetermined implantation condition,
wherein the predetermined implantation condition requires a predetermined energy width and the different implantation condition requires a different energy width smaller than the predetermined energy width.

21. An ion implanter comprising:
a radio frequency linear accelerator that accelerates supplied ions in accordance with an acceleration parameter;
an energy analysis magnet that is arranged downstream of the radio frequency linear accelerator and that generates an ion deflecting magnetic field in a vertical direction perpendicular to a beam traveling direction;
an energy analysis slit assembly that is arranged downstream of the energy analysis magnet and that is configured to enable switching between a standard slit opening having a first slit width in a horizontal direction perpendicular to the beam traveling direction and the vertical direction and a high-precision slit opening having a second slit width that is narrower than the first slit width in the horizontal direction;
a beam measurement unit that measures a beam current amount at a downstream of the energy analysis slit assembly; and
a controller that determines the acceleration parameter based on a beam current amount measured by the beam measurement unit with use of the high-precision slit opening.

22. A method of ion beam tuning in an ion implanter, the ion implanter comprising a radio frequency linear accelerator that accelerates supplied ions in accordance with an acceleration parameter, an energy analysis magnet that is arranged downstream of the radio frequency linear accelerator, and an energy analysis slit assembly that is arranged downstream of the energy analysis magnet, the energy analysis slit assembly configured to enable switching between a standard slit opening used for implantation processing performed under a predetermined implantation condition and a high-precision slit opening having higher energy precision than the standard slit opening and used to determine the acceleration parameter, the method comprising:
- switching the energy analysis slit assembly to the high-precision slit opening;
- measuring a beam current amount at a downstream of the high-precision slit opening; and
- determining the acceleration parameter for the predetermined implantation condition so that at least a part of the supplied ions is accelerated to have target energy, and so that the beam current amount measured is equivalent to a target beam current amount.

23. The method of ion beam tuning according to claim 22, wherein the ion implanter further comprises a processing chamber in which a workpiece is irradiated with an ion beam in the implantation processing,
- wherein the acceleration parameter is determined before a transportation container, which is arranged to transport the workpiece between the ion implanter and another device, is attached to the ion implanter to enable the workpiece to be transported into the processing chamber from the transportation container.

24. An ion implantation method using the method of ion beam tuning according to claim 23, comprising:
- switching the energy analysis slit assembly to the standard slit opening; and,
- after the transportation container is attached to the ion implanter, executing the implantation processing with use of the standard slit opening.

* * * * *